United States Patent
Nishimura et al.

(10) Patent No.: US 6,724,646 B2
(45) Date of Patent: Apr. 20, 2004

(54) DUMMY CELL STRUCTURE FOR 1T1C FERAM CELL ARRAY

(75) Inventors: Akitoshi Nishimura, Chiba (JP); Yukio Fukuda, Yamanashi (JP); Katsuhiro Aoki, Yamanashi (JP)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/397,409

(22) Filed: Mar. 26, 2003

(65) Prior Publication Data

US 2003/0202391 A1 Oct. 30, 2003

Related U.S. Application Data

(62) Division of application No. 10/102,418, filed on Mar. 19, 2002, now Pat. No. 6,587,367.

(51) Int. Cl.$^7$ .............................. G11C 11/22; G11C 7/00; G11C 7/02

(52) U.S. Cl. ............. 365/145; 365/189.07; 365/189.09; 365/203; 365/207; 365/210

(58) Field of Search ........................... 365/145, 189.07, 365/189.09, 203, 207, 210

(56) References Cited

U.S. PATENT DOCUMENTS 5,414,654 A * 5/1995 Kubota et al. ............... 365/145
5,572,459 A   11/1996 Wilson et al.
6,292,385 B1 * 9/2001 Kim ............................ 365/145

(List continued on next page.)

OTHER PUBLICATIONS

FeRAM Tutorial of ferroelectric capacitors and their applications for nonvolatile memories, also known as FeRAMs, Ali Sheikholeslami and P. Glenn Gulas, reprinted from the Internet at http://wwww.eecg.toronto.edu/~ali/ferro/tutorial.html.

(List continued on next page.)

*Primary Examiner*—David Nelms
*Assistant Examiner*—Ly Duy Pham
(74) *Attorney, Agent, or Firm*—Jacqueline J. Garner; W. James Brady, III; Frederick J. Telecky, Jr.

(57) ABSTRACT

A ferroelectric memory structure is described for the 1T1C arrangement in a ferroelectric capacitor cell array for FeRAM memory device applications. The device structure provides an accurate reference voltage and a simple sensing scheme for the sense amplifier used for reading the state of a target memory cell of the FeRAM array. A reference circuit generates a reference voltage which is a function of a charge shared between a plurality of FeRAM dummy cells. Each dummy cell of the plurality of FeRAM dummy cells is selectively coupleable to a plurality of bitlines. A shorting transistor in the reference circuit couples two bitlines or two bitline-bars neighboring the selected target memory cell. One dummy cell is coupled to a select one of the two shorted bitlines or bitline-bars, and another dummy cell is coupled to a another of the two shorted bitlines or bitline-bars, wherein at least one dummy cell is biased to a "0" state, and at least one other dummy cell is biased to a "1" state. As charge sharing takes place between the bias states of the dummy cells and the shorted bitlines, an averaged reference voltage is produced which is substantially centered between the "0" or "1" states. A sense amplifier receives a sense signal from the target memory cell on an associated bitline, and the averaged reference voltage is received on another bitline input of the sense amplifier. Thus, a new ferroelectric memory structure provides a centered reference voltage and a simple sensing scheme for the accurate sensing of the logic state of an FeRAM 1T1C cell for a read operation.

5 Claims, 20 Drawing Sheets

U.S. PATENT DOCUMENTS

| | | | |
|---|---|---|---|
| 6,297,986 B1 * | 10/2001 | Jae Kap | 365/145 |
| 6,363,002 B1 * | 3/2002 | Nishimura et al. | 365/145 |
| 6,501,674 B2 * | 12/2002 | Ashikaga | 365/145 |
| 6,574,133 B2 * | 6/2003 | Takashima | 365/145 |
| 2001/0055229 A1 * | 12/2001 | Koike | 365/200 |
| 2002/0079520 A1 * | 6/2002 | Nishihara et al. | 257/245 |
| 2002/0097619 A1 * | 7/2002 | Jacob et al. | 365/201 |

OTHER PUBLICATIONS

"A Survey of Circuit Innovations in Ferroelectric Random–Access Memories", Ali Sheikholeslami and P. Glenn Gulak, Proceedings of the IEEE, vol. 88, No. 3, May, 2000, pp. 667–689.

* cited by examiner

DUMMY CELL STRUCTURE FOR 1T1C FERAM CELL ARRAY

RELATED APPLICATION

This application is a divisional of Ser. No. 10/102,418 filed Mar. 19, 2002 now U.S. Pat. No. 6,587,367, which is entitled "Dummy Cell Structure for 1T1C FeRam Cell Array".

TECHNICAL FIELD OF INVENTION

The present invention relates generally to the field of memory devices, and more specifically to a ferroelectric memory device structure, which provides a simple sensing scheme, and an accurate reference voltage for a sense amplifier used for sensing a 1T1C cell of an FeRAM array.

BACKGROUND OF THE INVENTION

Several trends exist presently in the semiconductor device fabrication industry and the electronics industry. Devices are continuously getting smaller and requiring less power. A reason for these trends is that more personal devices are being fabricated which are relatively small and portable, thereby relying on a small battery as its primary supply source. For example, cellular phones, personal computing devices, and personal sound systems are devices which are in great demand in the consumer market. In addition to being smaller and more portable, personal devices are requiring more computational power and on-chip memory. In light of all these trends, there is a need in the industry to provide a computational device, which has memory and logic functions, integrated onto the same semiconductor chip. Preferably, this memory will be configured such that if the battery dies, the contents of the memory will be retained. Such a memory device which retains its contents while power is not continuously applied thereto is called a non-volatile memory. Examples of conventional non-volatile memory include: electrically erasable, programmable read only memory ("EEPROM") and FLASH EEPROM.

A ferroelectric memory (FeRAM) is a non-volatile memory which utilizes a ferroelectric material, such as strontium bismuth tantalate (SBT) or lead zirconate titanate (PZT), as a capacitor dielectric situated between a bottom electrode and a top electrode. Both read and write operations are performed for an FeRAM. The memory size and memory architecture affects the read and write access times of an FeRAM. Table 1 illustrates exemplary differences between different memory types.

TABLE 1

| Property | SRAM | Flash | DRAM | FeRAM (Demo) |
|---|---|---|---|---|
| Voltage | >0.5 V | Read >0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | >$10^{15}$ | <$10^5$ | >$10^{15}$ | >$10^{13}$ |
| Read Time (single/multi bit) | <10 ns | <30 ns | <30 ns/<2 ns | 60 ns |
| Read Endurance | >$10^{15}$ | >$10^{15}$ | >$10^{15}$ | >$10^{13}$ |
| Added Mask for embedded | 0 | ~6–8 | ~6–8 | ~3 |
| Cell Size (F~metal pitch/2) | ~80 $F^2$ | ~8 $F^2$ | ~8 $F^2$ | ~18 $F^2$ |
| Architecture | NDRO | NDRO | DRO | DRO |
| Non volatile | NO | YES | NO | YES |
| Storage | I | Q | Q | P |

The non-volatility of an FeRAM is due to the bistable characteristic of the ferroelectric memory cell. An FeRAM cell may be selected by two concurrent X and Y voltage pulses, respectively, wherein X and Y correspond to a specific bit line and word line, respectively, identified by horizontal and vertical decoder circuitry. The FeRAM cells of the capacitor array which receive only one voltage pulse remain unselected while the cell that receives both an X and Y voltage signal flips to its opposite polarization state or remains unchanged, depending upon its initial polarization state, for example. Two types of ferroelectric memory cells are used commonly, a single capacitor memory cell and a dual capacitor memory cell. The single capacitor memory cell (referred to as a 1T1C memory cell) requires less silicon area (thereby increasing the potential density of the memory array), but is less immune to noise and process variations. Additionally, a 1T1C cell requires a voltage reference for determining a stored memory state.

The dual capacitor memory cell (referred to as a 2T2C memory cell) requires more silicon area, and it stores complementary signals allowing differential sampling of the stored information. The 2T2C memory cell is more stable than a 1T1C memory cell. As illustrated in prior art FIG. 1, a 1T1C FeRAM cell 10 includes one transistor 12 and one ferroelectric storage capacitor 14. A bottom electrode of the storage capacitor 14 is connected to a drain terminal 15 of the transistor 12. The 1T1C cell 10 is read from by applying a signal to the gate 16 of the transistor (word line WL) (e.g., the Y signal), thereby connecting the bottom electrode of the capacitor 14 to the source of the transistor (the bit line BL) 18. A pulse signal is then applied to the top electrode contact (the drive line or plate line PL) 20. The potential on the bitline 18 of the transistor 12 is, therefore, the capacitor charge divided by the bitline capacitance. Since the capacitor charge is dependent upon the bistable polarization state of the ferroelectric material, the bitline potential can have two distinct values. A sense amplifier (not shown) is connected to the bitline 18 and detects the voltage associated with a logic value of either 1 or 0 associated with the FeRAM polarization. Frequently the sense amplifier reference voltage is a ferroelectric or non-ferroelectric capacitor connected to another bitline that is not being read. In this manner, the memory cell data is retrieved.

A characteristic of a ferroelectric memory is that a read operation is destructive in some applications. The data in a memory cell is then rewritten back to the memory cell after the read operation is completed. If the polarization of the ferroelectric is switched, the read operation is destructive and the sense amplifier must rewrite or restore (onto that cell) the correct polarization value as the bit just read from the cell. This is similar to the operation of a DRAM. If the drive line voltage was small enough not to switch the ferroelectric then the read operation was not destructive. In general, a non-destructive read requires a much larger capacitor than a destructive read and, therefore, requires a larger cell size.

As illustrated, for example, in prior art FIG. 2, a 2T2C memory cell 30 in a memory array couples to a bit line ("bitline") 32 and an inverse of the bit line ("bitline-bar") 34 that is common to many other memory types (for example, static random access memories). Memory cells of a memory block are formed in memory rows and memory columns. The 2T2C ferroelectric memory cell comprises two transistors 36 and 38 and two ferroelectric capacitors 40 and 42, respectively. The first transistor 36 couples between the bitline 32 and a first capacitor 40, and the second transistor 38 couples between the bitline-bar 34 and the second capacitor 42. The first and second capacitors 40 and 42 have a common terminal or plate (the plate line PL) 44 to which a signal is applied for polarizing the capacitors.

In a write operation, the first and second transistors 36 and 38 of the 2T2C ferroelectric memory cell 30 are enabled (e.g., via their respective word line 46) to couple the capacitors 40 and 42 to the complementary logic levels on the bitline 32 and the bitline-bar line 34 corresponding to a logic state to be stored in memory. The plate line common terminal 44 of the capacitors is pulsed during a write operation to polarize the 2T2C memory cell 30 to one of the two logic states.

In a read operation, the first and second transistors 36 and 38 of the 2T2C memory cell 30 are enabled via the word line 46 to couple the information stored on the first and second capacitors 40 and 42 to the bar 32 and the bitline-bar line 34, respectively. A differential signal (not shown) is thus generated across the bitline 32 and the bitline-bar line 34 by the 2T2C memory cell 30. The differential signal is sensed by a sense amplifier (not shown) which provides a signal corresponding to the logic level stored in memory.

FIG. 3 illustrates an array portion 200 of the 1T1C memory cell structure as described for FIG. 1. The array 200 has a plurality of element groupings which operate together in a modular fashion to read and write to memory cells. FIG. 3, for example, shows two element groupings, in which each grouping comprises a sense amplifier (210 or 215) to sense a memory cell associated with a pair of bitlines (B1 220 & B1-bar 222, or B2 224 & B2-bar 226), which is accessed by one of a plurality of word lines (W1–W4) and plate lines (PL1–PL4), with each wordline accessing a 1T1C memory cell 240. One element grouping, for example, comprises a sense amplifier 210, coupled to a pair of bitlines B1 220 & B1-bar 222 through a set of bitline isolation transistors 230 controlled by an isolation switch line 235, to permit isolation from the sense amplifier 210, and a memory cell 240. The 1T1C memory cell 240 is comprised of a pass gate transistor 242 and a ferroelectric capacitor 244, which is accessed by its respective word line 246, and plate line 248.

In the same way, FIG. 4 illustrates an array portion 300 of the 2T2C memory cell structure as described for FIG. 2. The array 300 has a plurality of element groupings which operate together in a modular fashion to read and write to memory cells. FIG. 4, for example, shows two element groupings, in which each grouping comprises a sense amplifier (310 or 315) to sense a memory cell associated with a pair of bitlines (B1 320 & B1-bar 322, or B2 324 & b2-bar 326), which is accessed by one of a plurality of word lines (W1–W4) and plate lines (PL1–PL4), with each wordline accessing a 2T2C memory cell 340. One element grouping, for example, comprises a sense amplifier 310, coupled to a pair of bitlines B1 320 & B1-bar 322 through a set of bitline isolation transistors 330 controlled by an isolation switch line 335, to permit isolation from the sense amplifier 310, and a memory cell 340.

The 2T2C memory cell 340 is comprised of a pair of 1T1C type cells, with one coupled to the B1 bitline 320, and the other coupled to the B1 bitline-bar 322. The 2T2C memory cell 340, thus comprises two pass gate transistors and two ferroelectric capacitors. One pass gate transistor 342 is operable to couple ferroelectric capacitor 344 to B1 bitline 320, when accessed by the W1 word line 346, and PL1 plate line 348, while another pass gate transistor 346 is operable to couple ferroelectric capacitor 348 to B1-bar (bitline-bar 322), when accessed by its respective word line 346, and plate line 348.

Currently, most FeRAM memory arrays apply the 2T2C cell structure, because of the difficulties involved with supplying an accurate reference voltage to the sense amplifier of the 1T1C cell.

As shown by the sensing scheme response plots 400 of FIG. 5, the 2T2C cell sensing scheme 410 is generally easy to implement, as the sense amplifier compares a charge driven from a bitline/bitline-bar at a "1" state 412 with a charge driven from a bitline-bar/bitline at a "0" state 414. The opposite state conditions on the bitline inputs to the sense amplifier, eliminate the need for an exacting reference voltage level.

The 2T2C sensing scheme plot 410, begins at a time $t_0$ 416, at a ½ $V_{CC}$ level, where the pass gate transistors (e.g., 342 & 346 of FIG. 4) couple their respective FeRAM capacitors (e.g., 344 & 348 of FIG. 4) to their respective bitlines (e.g., B1 320 & B1-bar 322 of FIG. 4), to produce the bitline charging plots 412 (the "1" state bitline) and 414 (the "0" state bitline), between times $t_0$ 416 and $t_{SENSE}$ 418. At time $t_{SENSE}$ 418, the charge voltage on the bitlines is affected by the sensing operation of the sense amplifier, and changes the voltages as shown, and as discussed previously. Also as discussed, the states on the memory cells which were read must be re-written into the array, because of this charge altering read operation. However, the 2T2C cell needs twice as much area as the 1T1C cell.

Also shown in the sensing scheme response plots 400 of FIG. 5, is the 1T1C cell sensing scheme plots 420 and 430. The read response to a "1" state sensing operation is illustrated by plot 420, while the read response to a "0" state sensing operation is illustrated by plot 430. The 1T1C cell sensing generally is not easy to implement, as the sense amplifier must compare the read sense charge voltage produced by a target memory cell on one bitline/bitline-bar 422 or 434, to a reference voltage generated on the other bitline-bar/bitline 424 or 432.

The 1T1C sensing scheme plot 420, begins at a time $t_0$ 426, at a ½ $V_{CC}$ level, where the pass gate transistor (e.g., 242 of FIG. 3) couples FeRAM capacitor (e.g., 244 of FIG. 3) to bitline (e.g., B1 220 of FIG. 3), to produce the bitline charging plots 422 (if a "1" state is sensed on the bitline) and 434 (if a "0" state is sensed on the bitline), between times $t_0$ 416 and $t_{SENSE}$ 418. Prior to sensing at time $t_{SENSE}$ 418, a reference voltage must be present, as indicated by line segment 426.

Relative to the "1" state sensing 422 of the plot 420, the reference 426 produced on the bitline opposite the read sensing of the memory cell, must be more negatively offset 428 as shown. Relative to the "0" state sensing 434 of the plot 430, the reference 436 produced on the bitline opposite the read sensing of the memory cell, must be more positively offset 438 as shown. As with the 2T2C cell sensing scheme, at time $t_{SENSE}$ 418, the charge voltage on the bitlines is affected by the sensing operation of the sense amplifier, and changes the voltages as shown, and as discussed previously. Also as discussed, the states on the memory cells which were read must be re-written into the array, because of this charge altering read operation. However, the 2T2C cell needs twice as much area as the 1T1C cell. Thus one difficulty for the 1T1C cell sensing scheme is the need for generating an accurate reference voltage level.

Without a precise reference voltage level, the sensing which is done by the sense amplifier will not be able to accurately sense the "1" or "0" states with an adequate margin of certainty.

Similarly, the prior art DRAM cell sensing schemes of FIG. 6 illustrates the same essential differences between the 2T2C and the 1T1C cell sensing schemes. The sensing scheme response plots 500 of FIG. 6 demonstrate that the 2T2C cell sensing scheme 510 generally is easy to implement, as the sense amplifier compares a charge driven from a bitline/bitline-bar at a "1" state 512 with a charge driven from a bitline-bar/bitline at a "0" state 514. The opposite state conditions on the bitline inputs to the sense amplifier, again eliminates the need for generating an exacting reference voltage level, but the 2T2C DRAM cell sensing also requires double the area of the 1T1C cell sensing scheme.

In the 1T1C DRAM, between time $t_0$ 516 and $t_{SENSE}$ 518, the bitline (or bitline-bar) voltage increases or decreases depending on the cell state "1" or "0", respectively. During this same time, reference voltage $V_{REF}$ of the bitline-bar (or the bitline) remains unchanged at the precharge level. Therefore, the sense amplifier connected to the bitline and bitline-bar can sense a "1" or "0" state by detecting the voltage difference between the two bitlines. In the case of the FeRAM, both the "1" and the "0" states will give the same direction voltage change, but with differing magnitudes. Therefore, the 1T1C "1" state response plot 520, and the "0" state response plot 530; demonstrate the same need for an exacting reference voltage for the DRAM as well as with the FeRAM.

Another prior art sensing scheme uses FeRAM "reference cells" or "dummy cells". The prior art reference cell includes 2 ferroelectric capacitors (FeCaps) that are fabricated generally identically to each other and to the array of memory cells. A prior art reference cell operates by charging one of the two FeCaps to a "1" state, and charging another to a "0" state, and allowing the two FeCaps to be coupled to a bitline and to charge share to create a reference voltage which is substantially half of that developed by a ferroelectric memory cell. Reference cells are only needed for certain memory cells, such as the 1T1C memory cells, that are not self-referenced, as with the DRAM or the 2T2C FeRAM sensing scheme. Although the prior art solves the problem of providing an accurate reference voltage for the 1T1C memory cells, a reference cell, or dummy cell comprising two FeCaps is used for each pair of bitlines.

Thus, conventional 2T2C FeRAM sensing schemes use excessive area for the applications considered. By contrast, conventional 1T1C cell sensing schemes, have only half the area, but require a means for generating an exacting reference voltage, and a more complex means of sensing.

Accordingly, there is a need for a simple sensing scheme for the 1T1C FeRAM memory cell, which senses the state of the cell with a greater margin of certainty, in a small low power solution.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a ferroelectric memory structure for the 1T1C cell arrangement in an array of ferroelectric capacitor cells used in FeRAM memory applications. In particular, the device structure provides an accurate reference voltage and a simple sensing scheme for the sense amplifier used for reading the state of a target (selected) memory cell of the FeRAM array. The array of FeRAM memory cells store binary data in a ferroelectric capacitor, which is accessed by a transistor in the usual manner, but only requires the smaller area of the 1T1C cell arrangement.

Conventional FeRAM memory devices using 2T2C FeRAM sensing schemes require nearly twice the area on chip, and use therefore excessive area for the applications considered. On the other hand, conventional 1T1C cell sensing schemes require only half the area, but require a means for generating an exacting reference voltage, and a more complex sensing scheme.

Consequently, the solution according to the present invention is to make an accurate reference voltage from a reference circuit, wherein the reference voltage is a function of a plurality of FeRAM dummy cells, and make each of these dummy cells operable to be coupled to a plurality of selectable bitlines. The sensing scheme of the present invention utilizes this reference circuit to generate the reference voltage, apply the reference voltage to one of the bitline inputs of a sense amplifier, and apply the target memory cell sense voltage to the other bitline input of the sense amplifier. The sense amplifier can then accurately determine from the differential voltage, the state of the FeRAM memory cell with a large margin of certainty.

The dummy cell structure and the particular sensing scheme of the present invention provide a dummy cell with a single FeCap within each dummy cell for a pair of bitlines, thereby reducing the quantity of dummy cells. This is made possible by a dummy cell control circuit, which provides a means of coupling the FeCap (within the dummy cell) to a plurality of bitlines. Therefore, the FeCap is not dedicated to coupling to one particular bitline, but is able to be coupled to plurality of bitlines according to the invention.

Conventional bitline and word line decode logic may be used to select the FeRAM cell to be read. The reference circuit generates a reference voltage which is a function of a plurality of FeRAM dummy cells. Two bitlines neighboring the selected memory cell are coupled by a bitline shorting transistor in the reference circuit, wherein at least one of the plurality of FeRAM dummy cells is biased to a "0" state, and at least one of the plurality of FeRAM dummy cells is biased to a "1" state. As charge sharing takes place between the dummy cells via the shorted bitlines, an averaging of the charge takes place producing the reference voltage (e.g., about (P+R+S)/Cbit) which is substantially centered between the "0" or "1" states. A plurality of sense amplifiers receives a cell sense voltage from the selected memory cell on an associated bitline, and the reference voltage is received on another bitline input of the sense amplifier. Thus, a ferroelectric memory structure provides a centered reference voltage and a simple sensing scheme for the accurate sensing of the logic state of an FeRAM 1T1C memory cell for a read operation.

Another aspect of the invention provides a reference circuit that generates a reference voltage from the "0" state charge of a single dummy cell which is charge shared to a selected pair of bitlines or pair of bitline-bars of a plurality of bitlines. As with the 2 dummy cell method above, the single dummy cell method also provides a mechanism for coupling the dummy cell to a choice of multiple bitlines, but in addition, the single dummy cell method provides a means of coupling the dummy cell to multiple pairs of bitlines. For example, a two bitline, and a 4-bitline implementation are included, but the dummy cell implementation and method of this aspect of the invention may be applied to any number of bitlines of the array. Even though the reference voltage (e.g., about (P+R+S/2)/Cbit) of this aspect of the present invention may be somewhat less precise than the two dummy cell reference circuit, the reference voltage which is produced is still substantially half of that developed by a ferroelectric memory cell, and may be used to reduce the quantity of dummy cells needed in the array.

According to another aspect of the invention, bitline access transistors within the dummy cell are provided to couple the FeCap to a plurality of bitlines, and may therefore also serve double duty as bitline shorting transistors to short between a neighboring pair of bitlines or a pair of bitline-bars associated with the FeRAM dummy cell and the sense amplifier of the ferroelectric memory device.

In accordance with the present invention a ferroelectric memory device and a method of sensing an FeRAM 1T1C memory cell in a read operation of the same comprises an array of FeRAM memory cells associated with a target memory cell which is to be read. A bitline and a word line are used to address and access the target memory cell via conventional bitline and word line decode logic. A reference circuit generates a reference voltage which is substantially half that developed by a ferroelectric memory cell. The reference circuit comprises two dummy cells which generate the reference voltage as a function of charge sharing between two dummy cells charged to opposite binary states. Each dummy cell comprises an FeCap with a dummy plate line to access and charge the FeCap, and a pair of access transistors to select a pair of bitlines or a pair of bitline-bars associated with the target memory cell to couple with the FeCap.

When the target memory cell is accessed and polled by a plate line voltage, an associated sense amplifier receives a sense voltage from the target memory cell on one bitline, and the reference voltage on another of the selected bitline pair associated with the reference circuit and the target memory cell. The sense amplifier compares the sense voltage to the reference voltage to make a determination as to a logic state of the target memory cell during a read operation.

Thus a ferroelectric memory device structure is disclosed which provides a simple sensing scheme and an accurate reference voltage for a sense amplifier used for sensing a 1T1C cell of an FeRAM array.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
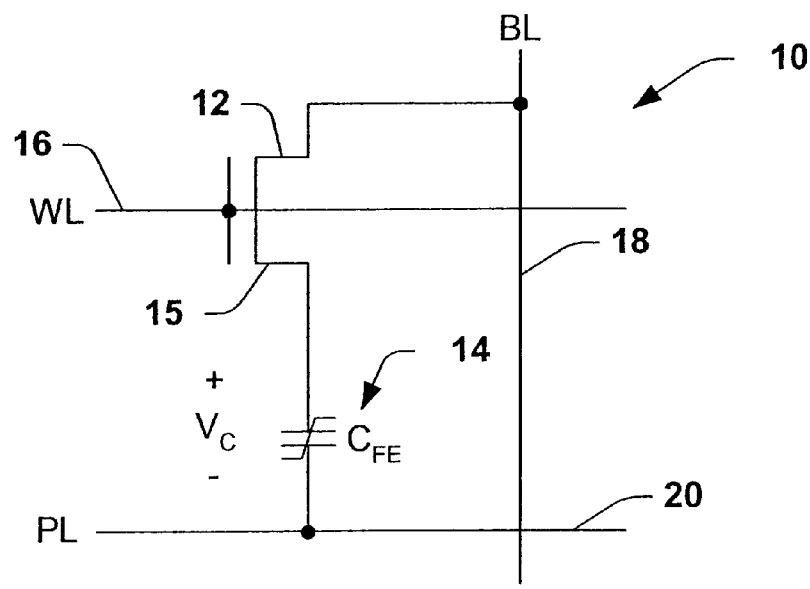
FIG. 1 is a partial schematic illustrating a prior art 1T1C FeRAM cell, comprising one transistor and one Ferroelectric capacitor.
Figure 2:
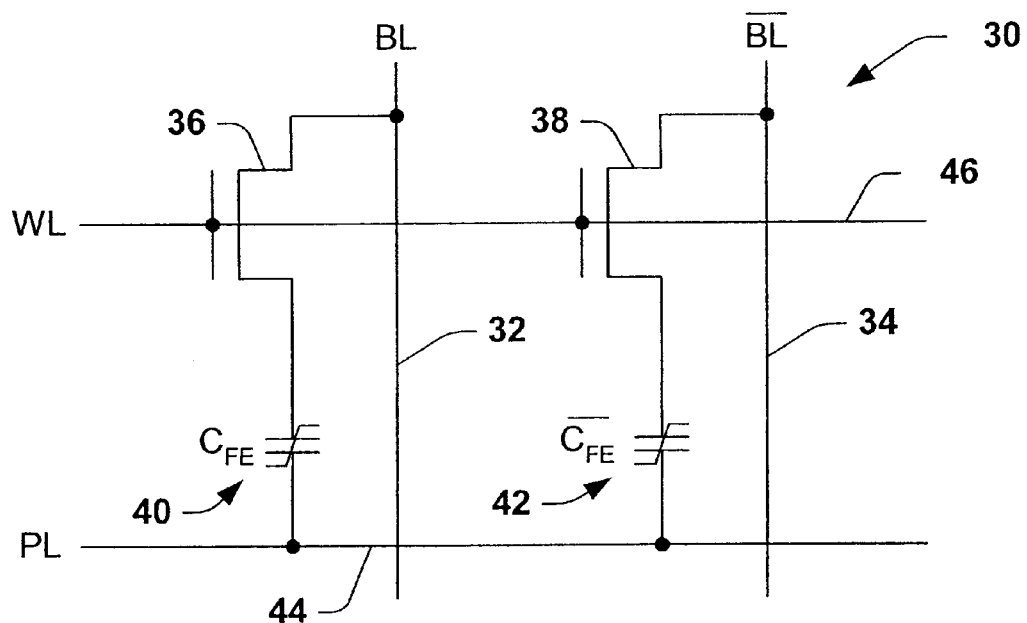
FIG. 2 is a partial schematic illustrating a prior art 2T2C memory cell comprising two transistors and two Ferroelectric capacitors.
Figure 3:
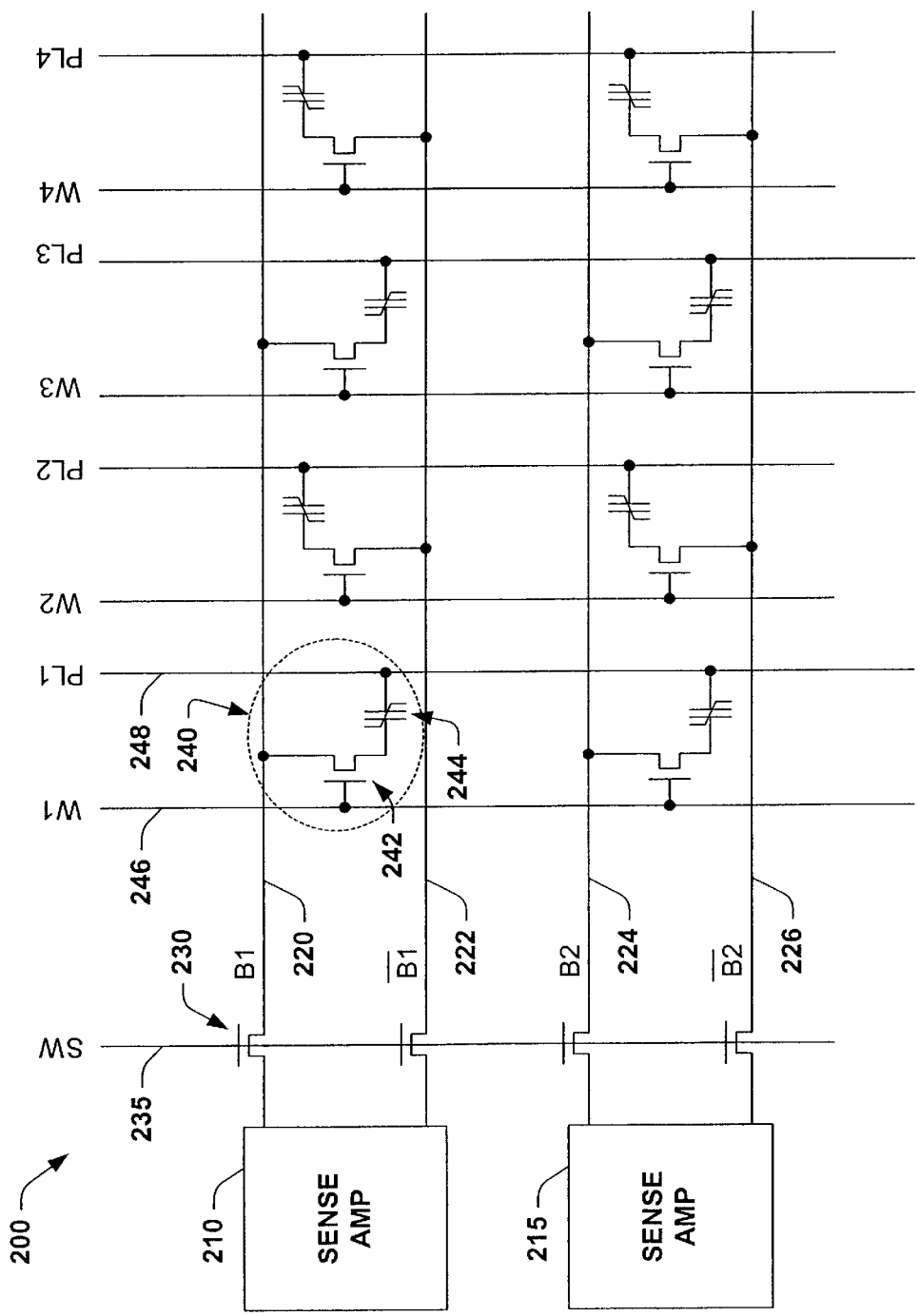
FIG. 3 is a simplified schematic illustrating an array portion of the 1T1C memory cell structure as described for FIG. 1.
Figure 4:
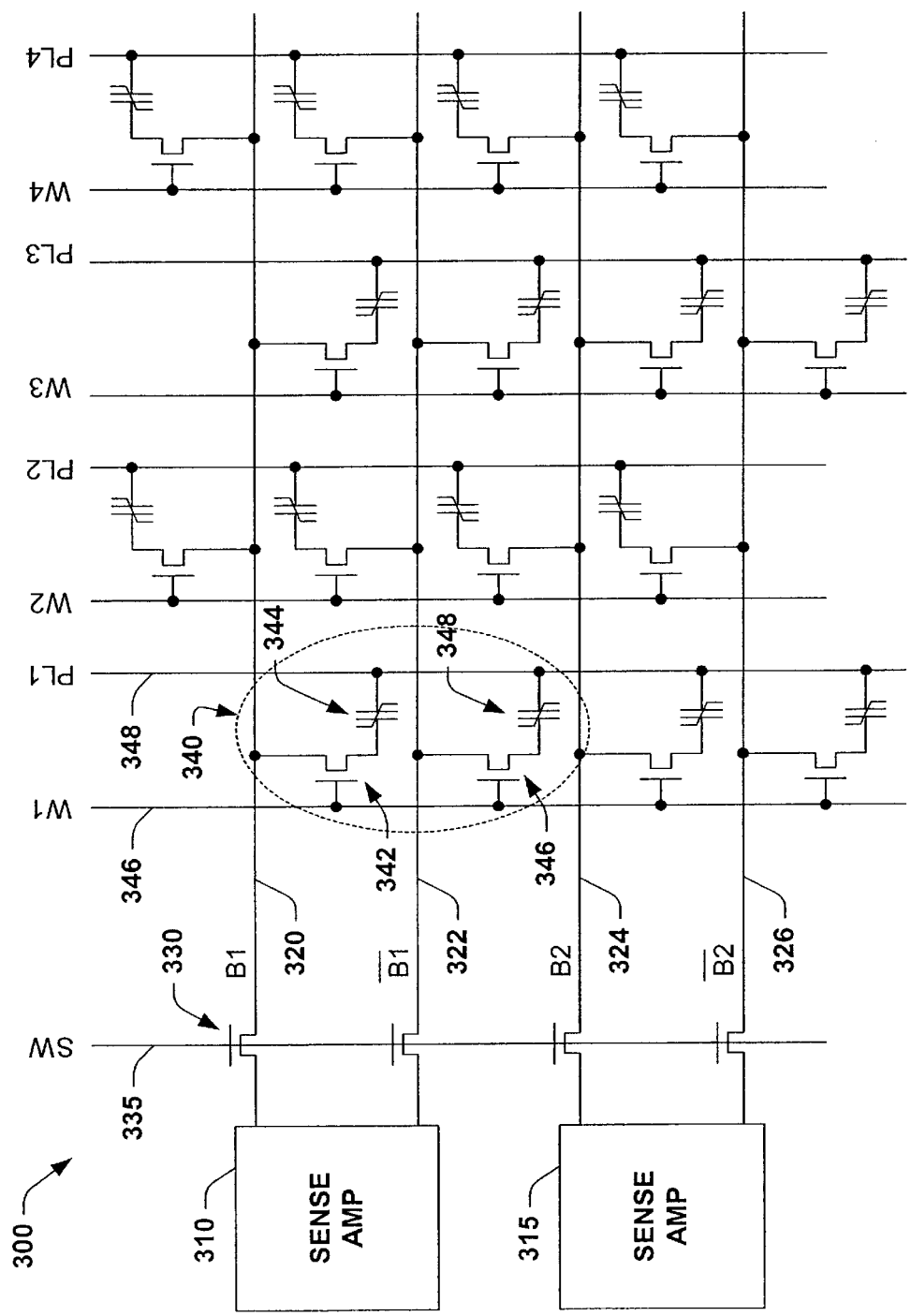
FIG. 4 is a simplified schematic illustrating an array portion of the 2T2C memory cell structure as described for FIG. 2.
Figure 5:
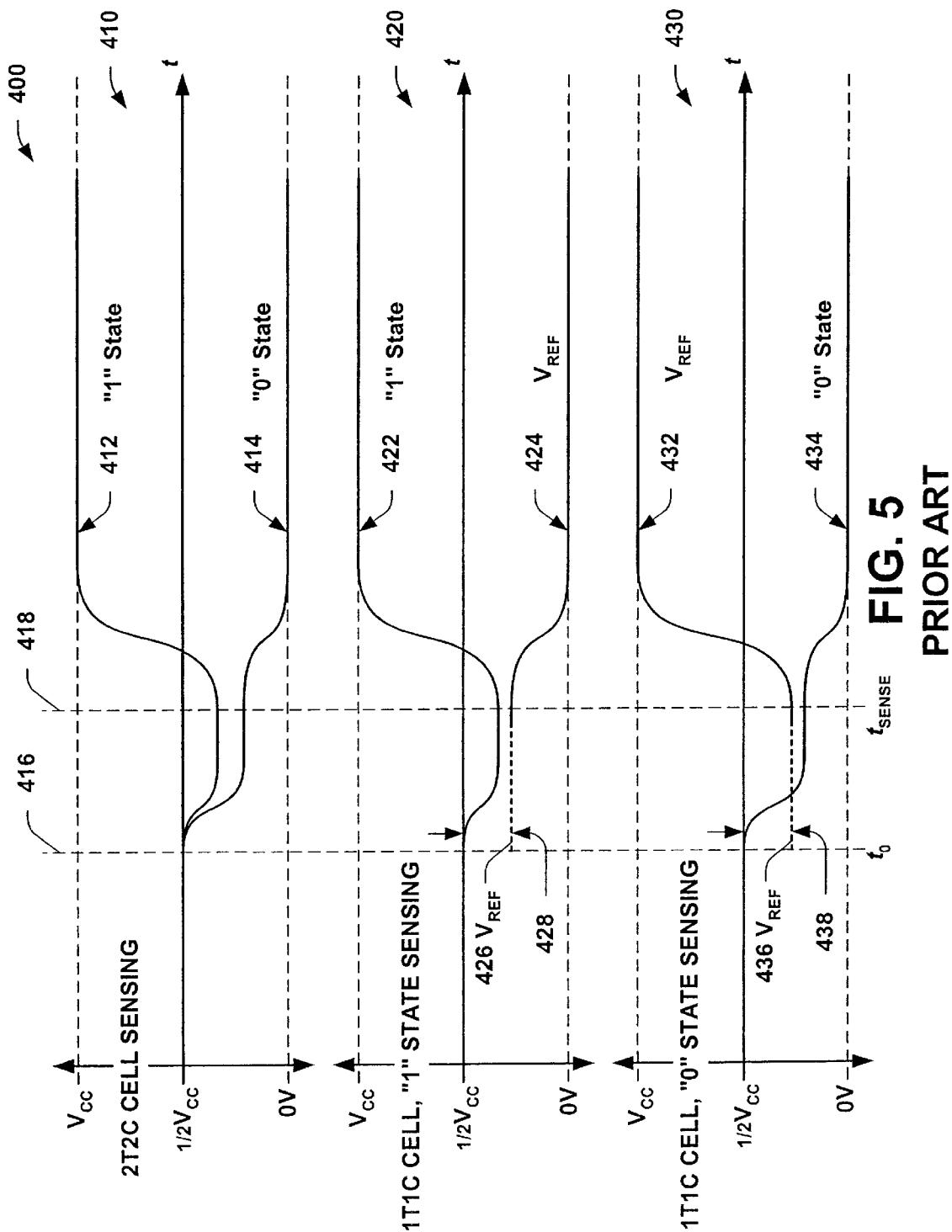
FIG. 5 is the sensing response plots of prior art FeRAM sensing schemes, of 2T2C cell sensing, 1T1C cell "1" state sensing, and 1T1C cell "0" state sensing.
Figure 6:
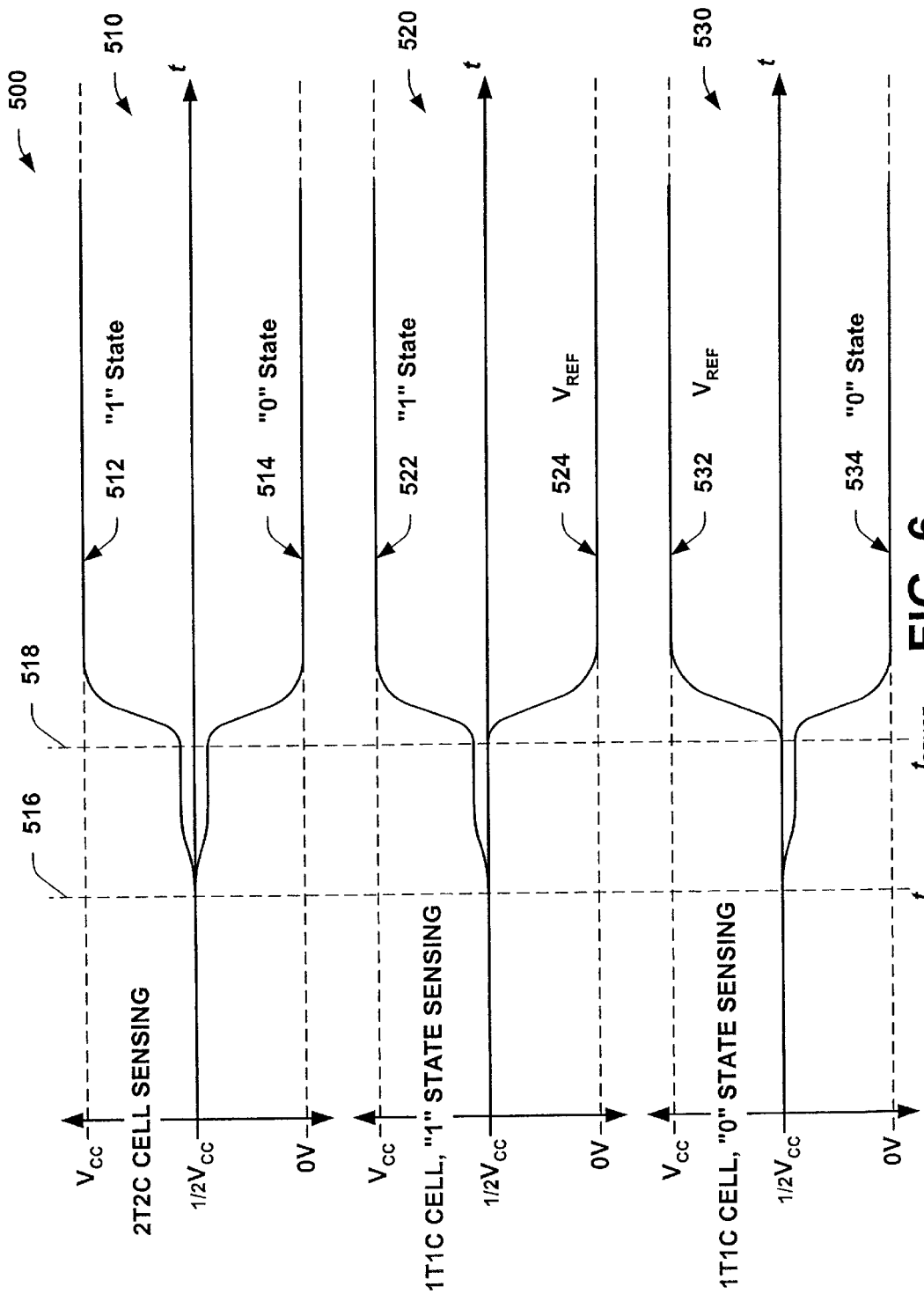
FIG. 6 is the sensing response plots of prior art DRAM sensing schemes, of 2T2C cell sensing, 1T1C cell "1" state sensing, and 1T1C cell "0" state sensing.

The present invention will now be described with reference to the drawings, wherein like reference numerals are used to refer to like elements throughout. The invention is directed to a ferroelectric memory structure for the 1T1C cell arrangement in an array of ferroelectric capacitor cells used in FeRAM memory applications. In particular, the device structure provides an accurate reference voltage and a simple sensing scheme for the sense amplifier used for reading the state of a target (selected) memory cell of the FeRAM array. The arrangement provides a reference circuit which includes one or more dummy cells comprising a single ferroelectric capacitor and one or more pairs of bitline access transistors. According to one implementation, the FeRAM memory structure of the present invention comprises a pair of oppositely precharged FeRAM dummy cells, which are selectively coupleable to a plurality of bitlines, which share charge with each other and a pair of shorted neighboring bitlines. Accordingly, a reference voltage is provided which is substantially centered between a "0" and a "1" state. Using this reference voltage, the sense amplifier may then determine to a greater margin, a "0" and a "1" state of the target memory cell of the FeRAM array.

The dummy cell structure and the sensing scheme of the present invention provide a dummy cell with a single FeCap within each dummy cell for a pair of bitlines, thereby in some implementations reducing the area requirements, quantity of control lines, and providing greater layout flexibility with fewer dummy cells. What makes this feature possible is a reference circuit comprising a dummy cell control circuit which provides a means of coupling the FeCap (within the dummy cell) to a plurality of bitlines. Therefore the reference circuit FeCap is not dedicated to coupling to one particular bitline, but is able to be coupled to plurality of bitlines according to the invention.

In accordance with the invention, several implementations of the ferroelectric memory structure and sensing scheme will be discussed. Generally, the schemes attempt to create an accurate reference voltage on one of the sense amplifier inputs associated with the target memory cell, while a sense signal from the target memory cell is produced on the other sense amplifier input.

One exemplary sensing scheme, the "two dummy cell scheme", uses two dummy cells, with an equal number of opposite "0" and a "1" charge state FeCaps to create a reference voltage which is substantially centered between the "0" and "1" states of an FeRAM memory cell. In the "two dummy cell scheme" the FeCap within each dummy cell is selectively coupleable to a plurality of bitlines, to cause a charge sharing of the opposite dummy cell states, and couple the charge and resultant reference voltage to the bitlines.

Another exemplary sensing scheme, the "one dummy cell scheme", uses a single dummy cell which is also selectively coupleable to a plurality of bitlines, but this scheme is coupleable by pairs of bitlines to the plurality of bitlines. The one dummy cell scheme transfers or shares a "0" state charge from the FeCap of the dummy cell to a pair of bitlines or a pair of bitline-bars rather than with another FeCap at a "1" state. As the capacitance of the two bitlines/bitline-bars will be, for all practical purposes, the same level of capacitance, the charge and resultant voltage transferred to the bitlines from the "0" state dummy cell will produce a reference voltage which is not as close to the center as the two dummy cell scheme, but still somewhat close to the center of the "0" and "1" states of an FeRAM memory cell.

Figure 7:
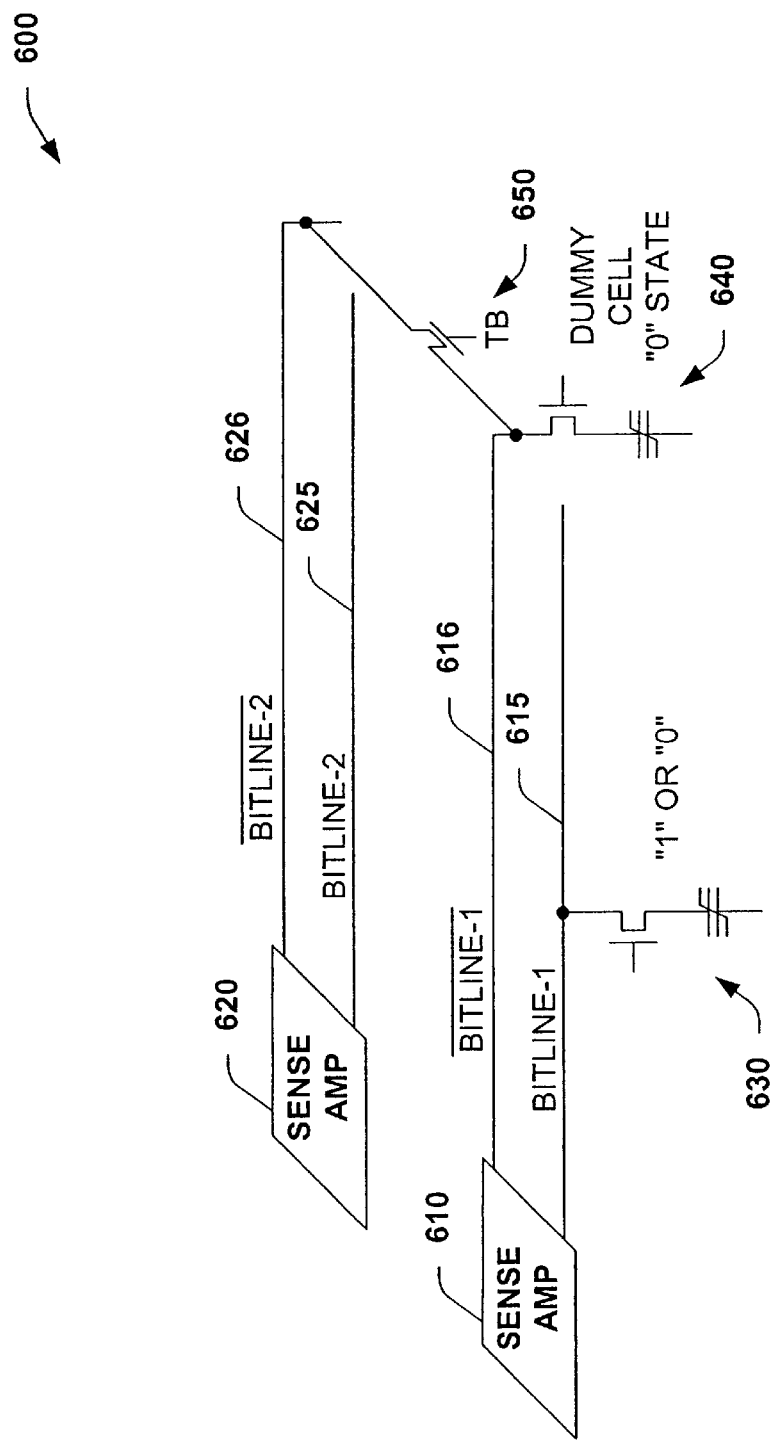
FIG. 7 is a simplified schematic diagram of an exemplary single FeRAM dummy cell sensing scheme used for 2 bitlines illustrating a target memory cell, a single FeRAM dummy cell, and a bitline shorting transistor, to generate a reference voltage and sense the state of an FeRAM memory cell of a ferroelectric memory device in which various aspects of the present invention may be carried out.

FIG. 7 illustrates a simplified schematic diagram 600 of the exemplary one dummy cell sensing scheme which may be used for creating a reference voltage on 2 bitlines. Diagram 600 illustrates two neighboring sense amps circuits of a typical array section, with a bitline (BL) and a bitline-bar (BL) associated with each sense amplifier. Sense amp 610 has a bitline 615 BL-1 and a bitline-bar 616 BL-1 which are associated therewith. Sense amp 610 also has a neighboring sense amp 620 which has a bitline 625 BL-2 and a bitline-bar 626 BL-2 which are associated with the sense amp 620. The neighboring sense amps therefore have neighboring pairs of bitlines and neighboring pairs of bitline-bars. Schematic diagram 600 also illustrates a target memory cell 630, a single FeRAM dummy cell 640, and a bitline shorting transistor 650 TB, all of which are associated with the sense amplifier 610, BL 615 and BL 616.

In accordance with an aspect of the present invention, FIG. 7 demonstrates the one dummy cell concept to generate a reference voltage and sense the state of an FeRAM memory cell of a ferroelectric memory device. The one dummy cell scheme produces a reference voltage for the sense amp 610, by allowing the charge from a "0" state dummy cell 640 to flow into a pair of bitlines which has been shorted by a shorting transistor 650 TB. The reference is produced on the bitline opposite of that which has the target memory cell to be read. In the example of FIG. 7, two neighboring BLs 616 & 626 are shorted and coupled with the dummy cell to produce the reference voltage, since the target memory cell 630 is only available to a BL. Further detail will accompany the more detailed figures.

Figure 8:
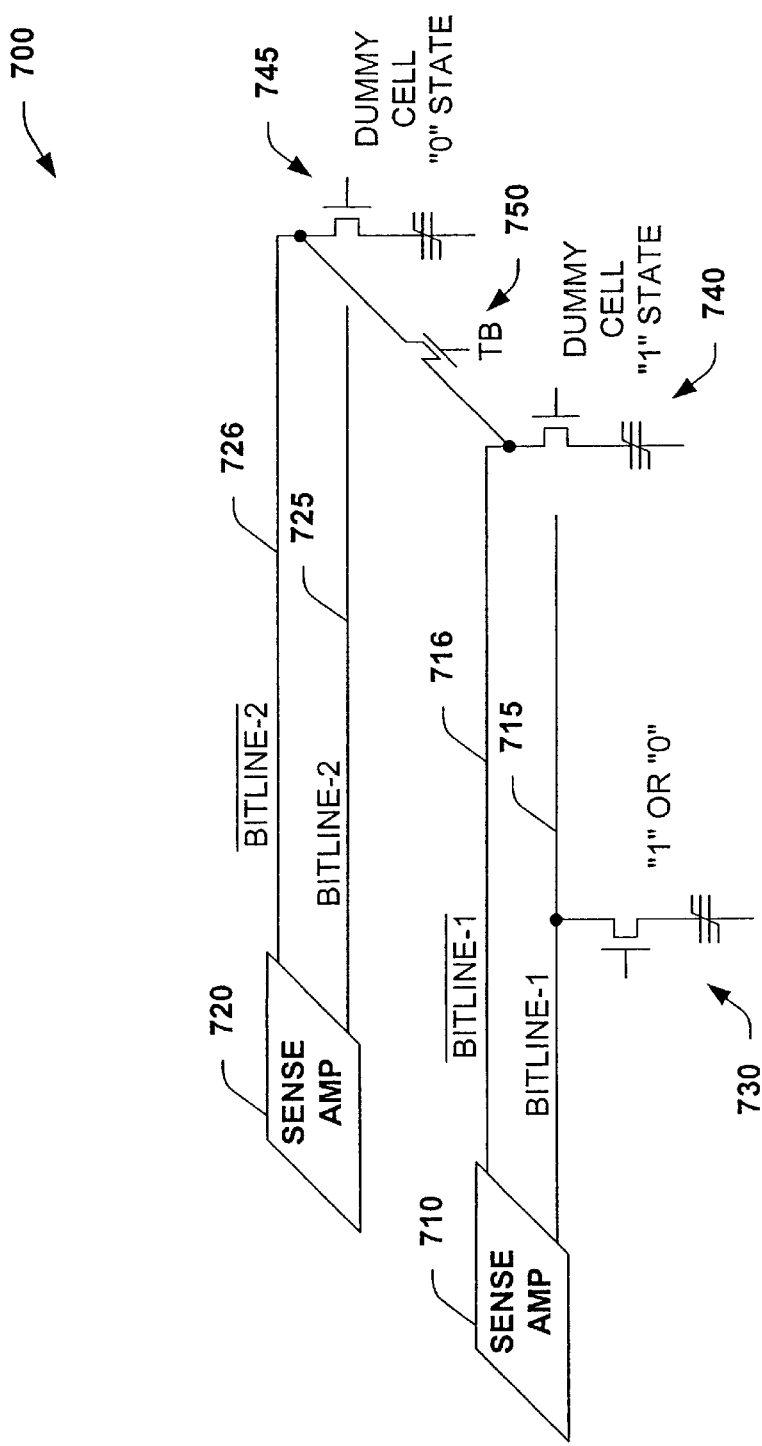
FIG. 8 is a simplified schematic diagram of an exemplary two FeRAM dummy cell sensing scheme used for 4 bitlines illustrating a target memory cell, two FeRAM dummy cell biased to opposite binary states, and a bitline shorting transistor, to generate a reference voltage and sense the state of an FeRAM memory cell of a ferroelectric memory device in which various aspects of the present invention may be carried out.

FIG. 8 illustrates a simplified schematic diagram 700 of the exemplary two dummy cell sensing scheme which may be used for creating a reference voltage on 4 bitlines. Diagram 700 illustrates two neighboring sense amps circuits of a typical array section, with a bitline (BL) and a bitline-bar (BL) associated with each sense amplifier. Sense amp 710 has a bitline 715 BL-1 and a bitline-bar 716 BL-1 which are associated with the sense amp 710. Sense amp 710 also has a neighboring sense amp 720 which has a bitline 725 BL-2 and a bitline-bar 726 BL-2 which are associated with the sense amp 720. The neighboring sense amps therefore have neighboring pairs of bitlines and neighboring pairs of bitline-bars. Schematic diagram 700 also illustrates a target memory cell 730, two FeRAM dummy cells 740 & 745 which are of opposite charge state, and a bitline shorting transistor 750 TB, all of which are associated with the sense amplifier 710, BL 715 and BL 716.

In accordance with an aspect of the present invention, FIG. 8 demonstrates the two dummy cell concept to generate a reference voltage and sense the state of an FeRAM memory cell of a ferroelectric memory device. The two dummy cell scheme produces a reference voltage for the sense amp 710, by allowing the charge from a "1" state dummy cell 740 and the charge from a "0" state dummy cell 745 to be shared by flowing into a pair of bitlines which has been shorted by a shorting transistor 750 TB. The reference is produced on the bitline opposite of that which has the target memory cell to be read. In the example of FIG. 7, two neighboring BLs 716 & 726 are shorted and coupled with the dummy cells to produce the reference voltage, since the target memory cell 730 is only available to a BL. Further detail will accompany the more detailed figures.

Figure 9:
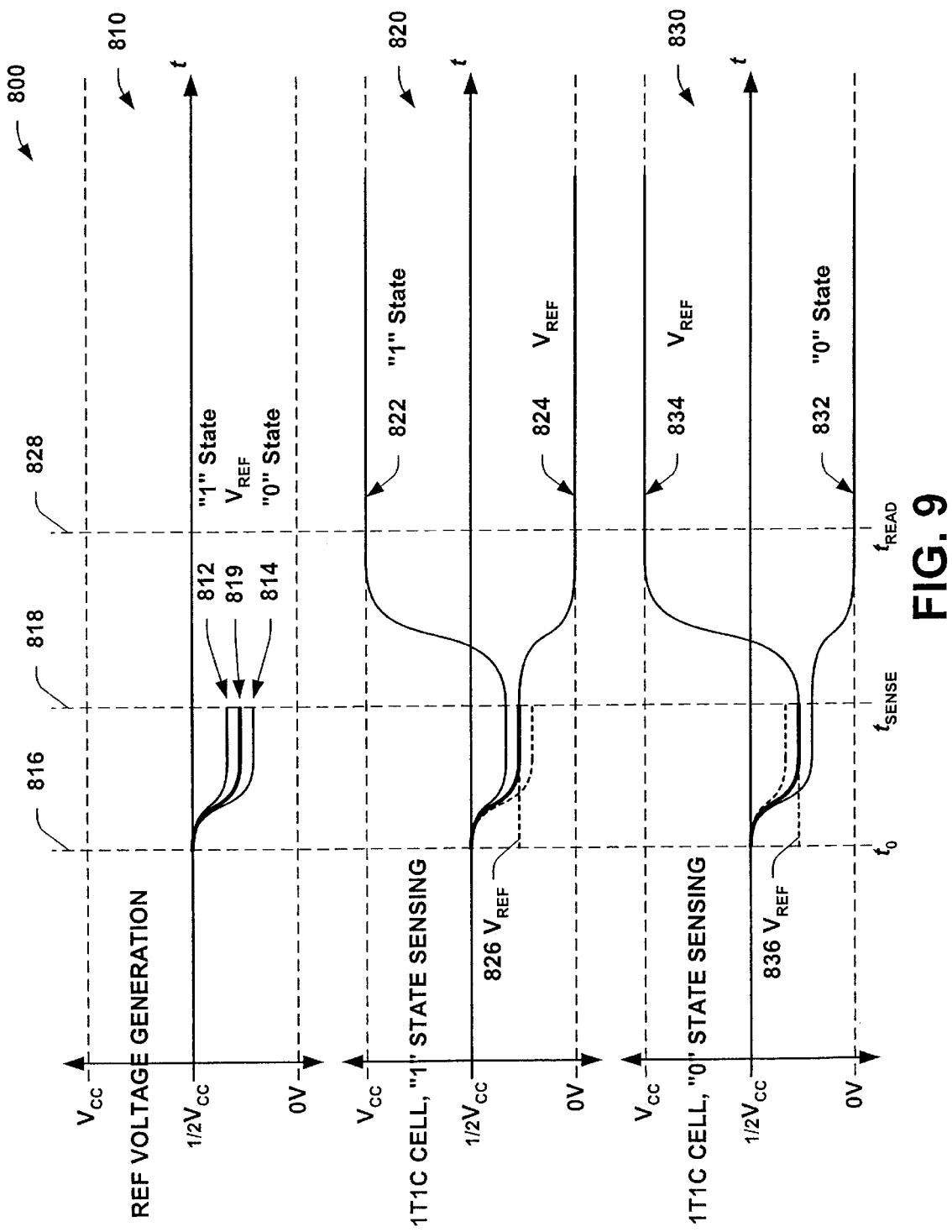
FIG. 9 is the sensing response plots of the reference voltage generation, of a 1T1C cell "1" state sensing, and of a 1T1C cell "0" state sensing, for the FeRAM sensing schemes according to an aspect of the present invention.

FIG. 9 is the sensing response plots 800 of the reference voltage generation 810, of a 1T1C cell "1" state sensing 820, and of a 1T1C cell "0" state sensing 830 for the FeRAM sensing scheme according to an aspect of the present invention. Plot 810 illustrates the reference voltage output from the reference voltage circuit which begins at time $t_0$ 816, where the reference voltage is $\frac{1}{2}V_{CC}$ from a precharge of the bitlines to $\frac{1}{2}V_{CC}$. From time $t_0$ 816, to time $t_{SENSE}$ 818, plot 812 demonstrates the response of a "1" state dummy cell, while plot 814 demonstrates the response of a "0" state dummy cell. Plot 819 demonstrates the response in the reference circuit, as the "0" state and the "1" state dummy cells share their charge into the shorted bitlines/bitline-bars. As shown, the reference voltage response 819 is centered midway between the "0" and "1" state responses. This centered response 819 is particularly true of the two dummy cell scheme, however, the one dummy cell scheme produces a response which is slightly closer to the "1" state response.

Plot 820 demonstrates the response of the bitlines into a sense amp when a "1" state 1T1C FeRAM memory cell is sensed. Plot 822 shows what happens to the bitline of the sense amp attached to the target memory cell, as it swings toward VCC indicating a "1" state determination. Plot 824 shows what happens to the bitline of the sense amp coupled to the reference circuit and the dummy cells, as it swings toward 0 volts as $V_{REF}$. Prior to time $t_0$ 816, the reference and the target memory cell bitlines have been precharged to $\frac{1}{2}V_{CC}$. The response then begins at time $t_0$ 816, with the reference bitline responding to the charge coupled from the dummy cells, and the target memory cell bitline responding to the charge coupled from the target cell. At time $t_{SENSE}$ 818, the shorted bitlines are at the reference voltage $V_{REF}$ 826. Then, by time $t_{READ}$ 828, the plot 824 of the bitline used for the reference voltage is pulled toward 0 volts by the sense (read) process, and the state of the target memory cell may be determined.

Plot 830 demonstrates the response of the bitlines into a sense amp when a "0" state 1T1C FeRAM memory cell is sensed. Plot 832 shows what happens to the bitline of the sense amp attached to the target memory cell, as it swings toward 0 volts indicating a "0" state determination. Plot 834 shows what happens to the bitline of the sense amp coupled to the reference circuit and the dummy cells, as it swings toward $V_{CC}$ as $V_{REF}$. Prior to time $t_0$ 816, the reference and the target memory cell bitlines have been precharged to $\frac{1}{2}V_{CC}$. The response then begins at time $t_0$ 816, with the reference bitline responding to the charge coupled from the dummy cells, and the target memory cell bitline responding to the charge coupled from the target cell. At time $t_{SENSE}$ 818, the shorted bitlines are at the reference voltage $V_{REF}$ 836. Then, by time $t_{READ}$ 828, the plot 834 of the bitline used for the reference voltage is pulled toward $V_{CC}$ by the sense (read) process, and the state of the target memory cell may be determined.

Figure 10B:
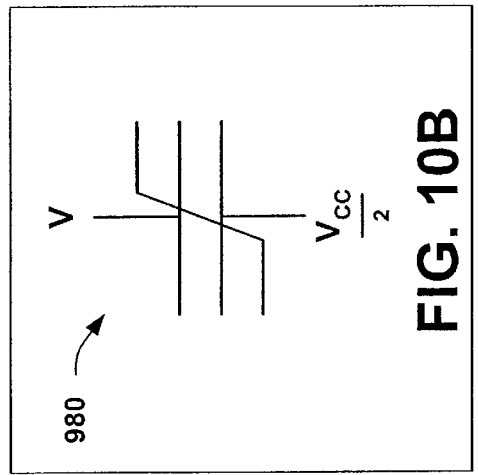
FIG. 10B is an accompanying schematic symbol of the Ferroelectric capacitor of FIG. 10A, and the typical ½$V_{CC}$ polling voltage applied to the plate line.
Figure 10A:
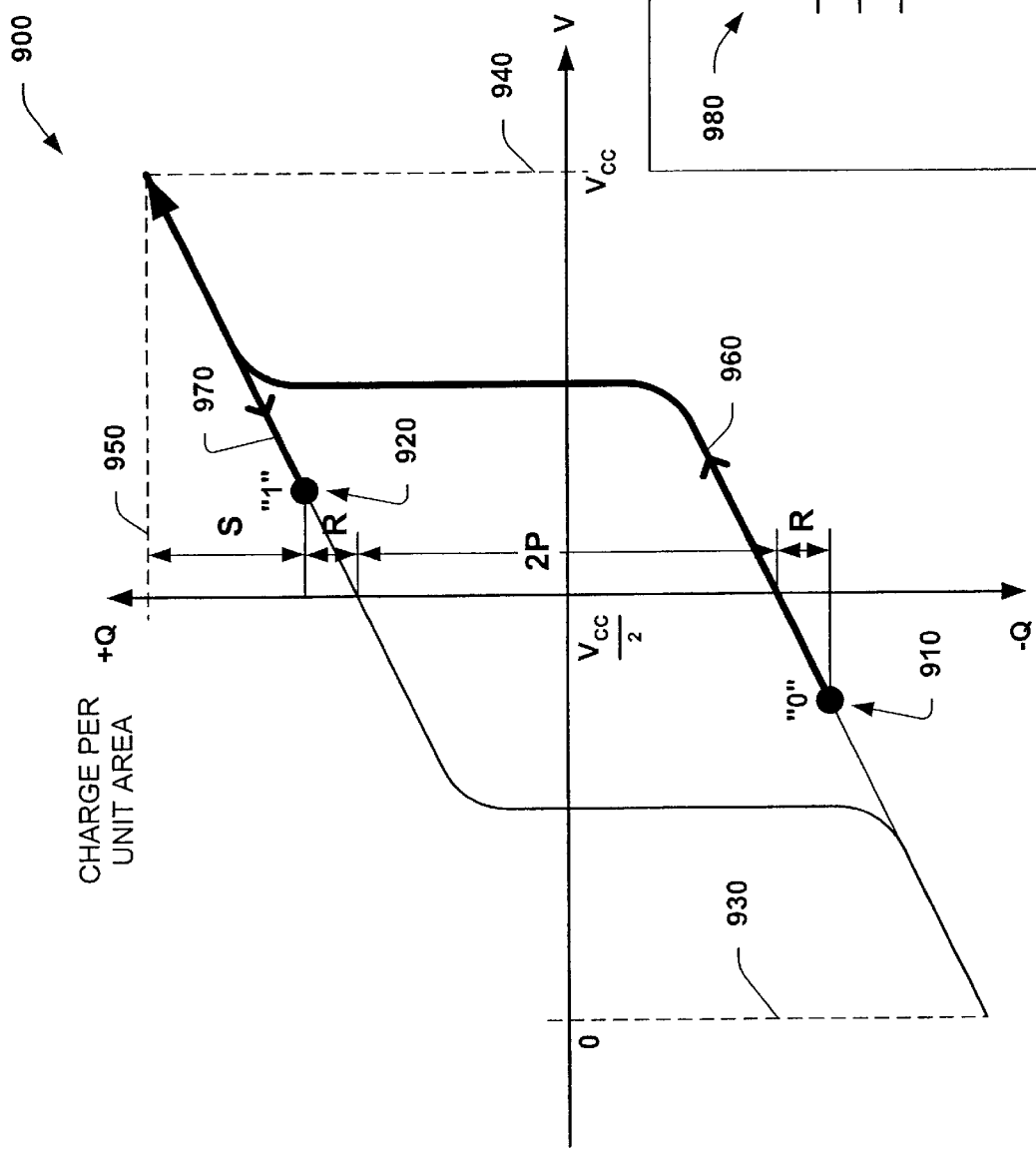
FIG. 10A is a characteristic curve plot of the Ferroelectric capacitor, illustrating the charge "Q" (y-axis), and the voltage "V" (x-axis), including the characteristics placement relationship of a "1" state and a "0" state in a typical FeCap.

FIG. 10A is the characteristic curve plot 900 of a Ferroelectric capacitor. Plot 900 illustrates the charge "Q" (y-axis), and the voltage "V" (x-axis), including the characteristics placement relationship of a "0" state 910, and a "1" state 920 in a typical FeCap. The voltage "V" (x-axis) ranges from 0 volts 930 to $V_{CC}$ 940. The charge "Q" (y-axis) ranges as high as P+R+S (950). The "0" state requires a charge greater than or equal to –(R+P+S), while the "1" state requires a charge greater than or equal to P+R+S to produce a state change of the FeCap.

Also in FIG. 10A, the quantity P is the "polarization charge", R is the "Remnant charge", and S is the "Saturation charge". These quantities identify most characteristics of the FeCap. Characteristic curve segment 960 represents the charge path from a "0" state cell, thru $V_{CC}$ 940 as charge is applied to a FeCap, and then thru curve segment 970 to the stable "1" state as the voltage is relaxed to the FeCap. FIG. 10B is the schematic symbol 980 of the Ferroelectric capacitor of FIG. 10A, and the typical $\frac{1}{2}V_{CC}$ polling voltage which is applied to the plate line.

Figure 11:
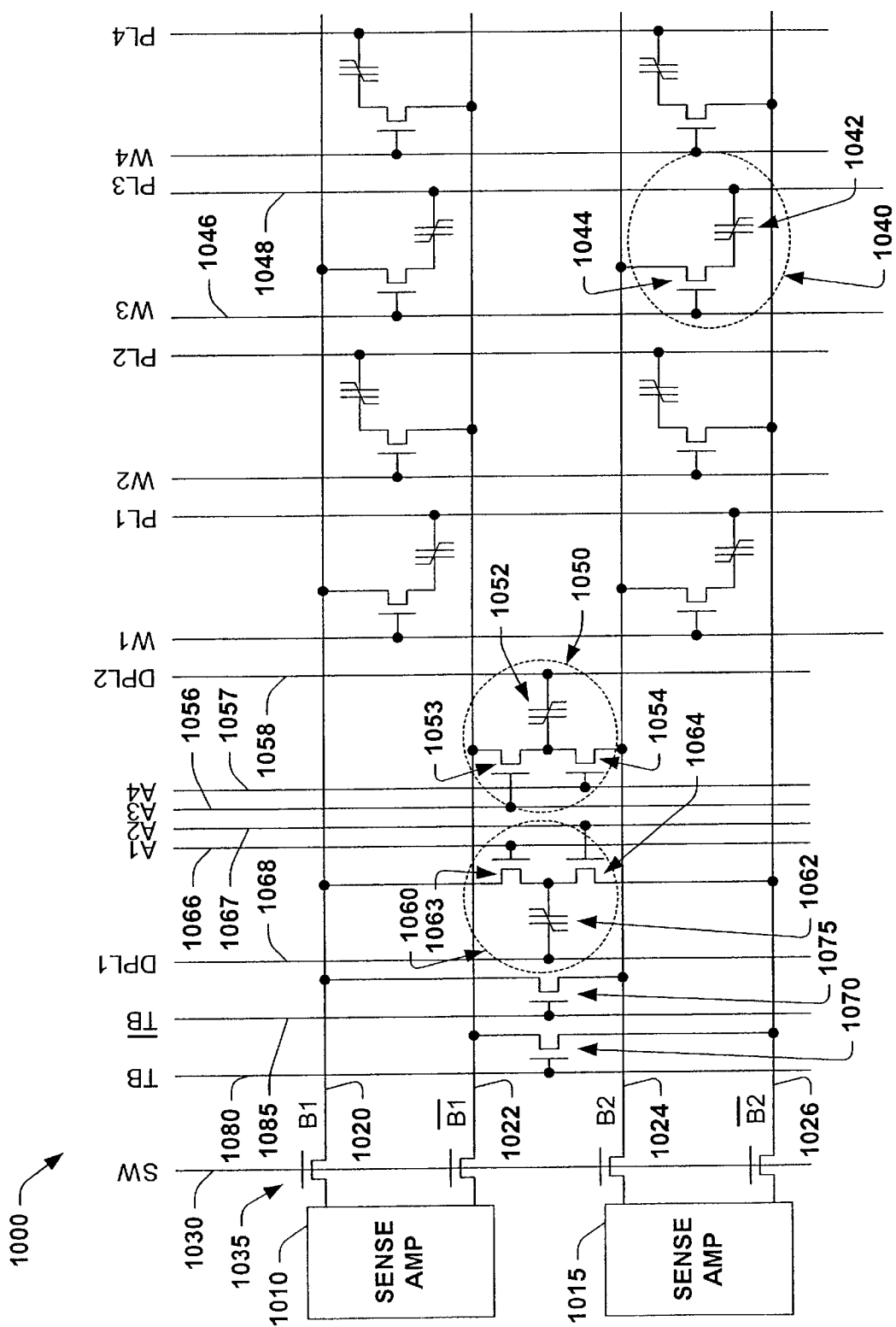
FIG. 11 is a schematic diagram illustrating an array portion of an exemplary two FeRAM dummy cell sensing scheme, used for 4 bitlines in a 1T1C FeRAM memory cell structure as described for FIG. 8, according to an aspect of the present invention.

FIG. 11 is a schematic diagram 1000 which illustrates an array portion of an exemplary two FeRAM dummy cell sensing scheme which is used to sense the state of any memory cell attached to the 4 bitlines shown in the exemplary 1T1C FeRAM memory cell structure as described for FIG. 8, according to an aspect of the present invention.

The FeRAM memory structure uses a reference circuit comprising a plurality of FeRAM dummy cells which is selectively coupleable to a plurality of bitlines. The reference circuit selects a pair of the plurality of bitlines and shorts together the selected pair of the plurality of bitlines, and generates a reference voltage which is a function of a charge shared between a "0" state and a "1" state dummy cell of the plurality of FeRAM dummy cells. The reference circuit also applies the reference voltage to the selected pair of the plurality of bitlines associated with the reference circuit and the target memory cell during a read operation.

Again, two neighboring sense amp circuits are shown with associated neighboring BLs and BLs. Sense amp 1010 neighbors sense amp 1015. Sense amp 1010 has bitline B1 1020 and bitline-bar B1 1022 which are associated with the sense amp 1010. Sense amp 1015 has a bitline B2 1024 and a bitline-bar B2 1026 which are associated with the sense amp 1015.

Isolation switch line 1030 is connected to the gates of bitline isolation transistors 1035. Optional bitline isolation transistors 1035 are normally ON, but for convenience, may be switched OFF just before the sense amp functions in order to reduce the sensing time. Bitline capacitance is large, therefore the sense amp may work faster without the bitlines under certain conditions.

Memory cells of the array of FeRAM memory cells 1000 may be addressed and selected by word lines, plate lines, and bitlines via decode logic of the same. One particular memory cell of the array of FeRAM memory cells is chosen as a target memory cell 1040, which is to be sensed for a read operation, comprising a FeCap 1042, and an pass gate transistor 1044. Pass gate transistors provide a means of selection and coupling of the target memory cell to a bitline associated with the target memory cell. For example, word line 1046 is connected to the gate of the pass gate transistor 1044 to select and couple FeCap 1042 to its associated bitline B2 1024, while the plate of FeCap 1042 is selected via plate line PL3 1048.

Exemplary schematic diagram 1000 of FIG. 11 of the present invention illustrates two dummy cells that provide a reference for the 4 bitlines shown. In one exemplary method, one dummy cell is precharged to a "0" state, and the other dummy cell is precharged to a "1" state. A first dummy cell 1050 comprises a FeCap 1052, and two bitline access transistors 1053 & 1054. The bitline access transistors for each FeCap permit selection and addressing of a bitline and a means of coupling the FeCap to a selected bitline. For example, bitline access transistor 1053 is addressed by gate address line A3 1056, and bitline access transistor 1054 is addressed by gate address line A4 1057.

A second dummy cell 1060 comprises a FeCap 1062, and two bitline access transistors 1063 & 1064. Bitline access transistor 1063 is addressed by gate address line A1 1066, and bitline access transistor 1064 is addressed by gate address line A2 1067. Each of the two dummy cells 1050 & 1060 is therefore selectively coupleable to two bitlines. In the example of FIG. 11, FeCap 1052 of the first dummy cell, is selectively coupleable to bitline-bar B1 1022 and a bitline B2 1024, while FeCap 1062 of the second dummy cell, is selectively coupleable to bitline B1 1020 and a bitline-bar B2 1026. Alternatively, the two dummy cells may be selectively coupleable to a plurality of bitlines.

Sense amps 1010 and 1015 have neighboring pairs of bitline-bars (1022 & 1026) which may be shorted by shorting transistor 1070, and neighboring pairs of bitlines (1020 & 1024) which may be shorted by shorting transistor 1075. Shorting transistor 1070 is selected and switched by a bitline-bar shorting line TB 1080, and shorting transistor 1075 is selected and switched by a bitline shorting line TB 1085.

In operation of the two dummy cell scheme of FIG. 11, a particular memory cell is selected, for example target memory cell 1040 which is associated with bitline B2 1024, and sense amp 1015. As sense amp 1015 will have a sense signal from the target memory cell input to the BL input of the sense amp, the reference voltage will be produced on the BL input of the sense amp. Therefore, the BL shorting line TB 1080 is made active to cause shorting transistor 1070 to couple B1 and B2 together in preparation as the reference bitline input to the sense amp. To produce the reference voltage, a dummy cell which was precharged to a "0" state, will share charge (via the shorted BLs or BLs) with another dummy cell which was precharged to a "1" state.

For the example, the target memory cell 1040 is initialized with a 0V plate voltage at PL3 1048 and has its charge coupled to bitline B2 with pass gate transistor 1042 using word line W3 1046. Assume, for example, FeCap 1052 is a "1" state and is coupled to B1 via bitline access transistor 1053, and FeCap 1062 is a "0" state and is coupled to B2 via bitline access transistor 1064. The opposite states of the dummy cell FeCaps share charge on B2 to produce the reference voltage for the sense amp 1015.

The B1 & B2 short is then removed, and the sense amp 1015 is enabled. In response, the target memory cell sense voltage swings to one state, depending on the "1" or "0" state, while the reference voltage swings toward the opposite state on the BL and BL inputs correspondingly of the sense amp 1015. The sense amp compares the two inputs, and a determination is made as to the "1" or "0" state of the target memory cell.

½$V_{CC}$ is then applied to the plate lines of both dummy cells and the target memory cell, and both dummy cells are then recoupled to the opposite bitline or bitline-bar, to recharge (restore) the dummy cells and the target memory cell. The dummy cells actually go to the opposite states prior to the read operation, while the target memory cell is restored to its original state. The target memory cell and the dummy cells are disconnected from their associated bitlines so that the capacitance state is maintained. The target memory cell and the dummy cell plate lines are re-initialized to 0V, and are ready for another read operation.

Thus, from FIGS. 10A & 10B, and 11, the dummy cells are shown to share as follows:

| Given: | $Q = C \cdot V$, and $V = Q/C$ |
|---|---|

Where Cbit is the bitline capacitance, and
Where Q is the charge transferred to the bitlines, and
Where V is the voltage drop induced on the bitlines due to the charge transfer:

| the "0" state charge is: | $Q_0 = 2P + 2R + S$ | and |
| the "1" state charge is: | $Q_1 = S$ | therefore |
| the "0" state voltage is: | $V_0 = (2P + 2R + S)/Cbit$ | and |
| the "1" state voltage is: | $V_1 = S/Cbit$ | |

Now the two dummy cells with a "0" state & a "1" state, average when

| connected together yield: | $V_{DROP} = (V_0 + V_1)/2$ or, $= (Q_0 + Q_1)/2\ Cbit$ |
| Or: | $V_{DROP} = (2P + 2R + S + S)/2\ Cbit$ |
| Simplifying: | $V_{DROP} = (P + R + S)/Cbit$ (the center of the "0" & "1") |

$V_{DROP}$ is the voltage drop produced by the charge transfer from the "0" state and "1" state dummy cells to the shorted bitlines associated with the sense amplifier and the target memory cell, but opposite the bitline coupled to the target memory cell.

Advantageously, the two dummy cell sensing scheme may provide a significantly centered reference voltage for a 1T1C FeRAM memory cell read operation in some applications, for example, requiring only two FeCaps for four bitlines. Such an architecture substantially reduces the memory area over prior art dummy cell solutions that required a dummy cell for each bitline.

Figure 12A:
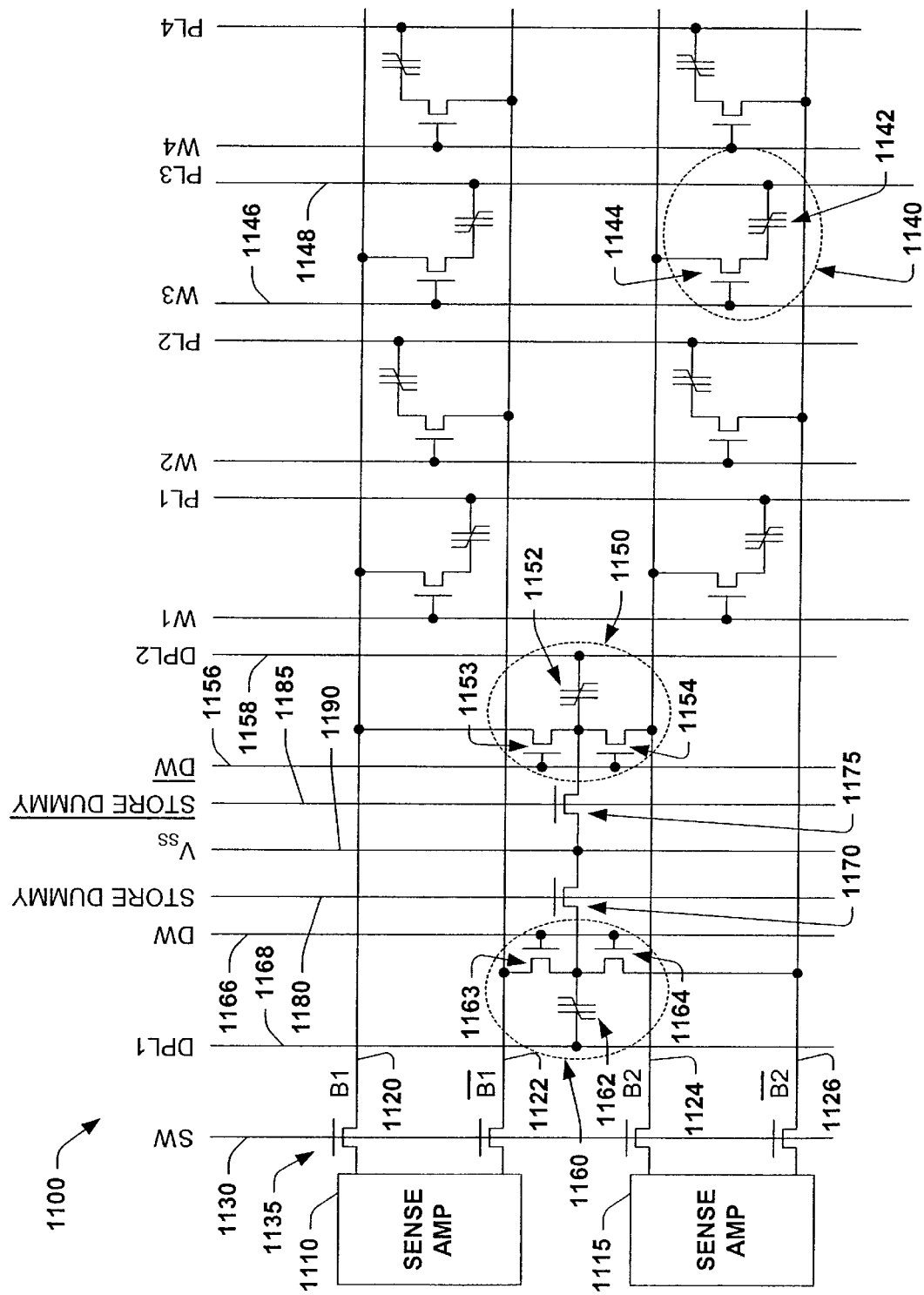
FIG. 12A is a schematic diagram illustrating an array portion of an exemplary one FeRAM dummy cell sensing scheme, wherein one dummy cell is used for a pair of bitlines and another dummy cell is used for a pair of bitline-bars, using 2 dummy cells for 4 bitlines in a 1T1C FeRAM memory cell structure as described for FIG. 8, according to another aspect of the present invention.

FIG. 12A is a schematic 1100 which illustrates an array portion of the exemplary one FeRAM dummy cell sensing scheme, and as shown in the exemplary 1T1C FeRAM memory cell structure as described for FIG. 7. According to an aspect of the present invention, when two of these dummy cells are used, as shown in FIG. 12A, the state of any memory cell attached to the 4 bitlines may be sensed.

Note, as previously discussed, that the one dummy cell scheme uses a single dummy cell at the "0" state to generate the reference voltage by dividing its charge between a shorted pair of bitlines, whereas the two dummy cell scheme generates the reference voltage by sharing the charge between two dummy cells of opposite "0" and "1" states over a shorted pair of bitlines. Thus, the particular exemplary circuit of FIG. 11 of the two dummy cell scheme and the circuit of FIG. 12A of the one dummy cell scheme both use a total of two dummy cells for the 4 bitlines, but use entirely different schemes. Another scheme will be presented in FIG. 12B which uses only one dummy cell for all 4 of the exemplary bitlines.

Referring back to FIG. 12A, the exemplary FeRAM memory structure uses a reference circuit comprising a plurality of FeRAM dummy cells, wherein each dummy cell is coupleable to a select neighboring pair of bitlines of a plurality of bitlines. The reference circuit selects the neighboring pair of bitlines of the plurality of bitlines and shorts the pair of bitlines together. The reference circuit also generates a reference voltage by coupling the dummy cell to the selected pair of the plurality of bitlines associated with the reference circuit and the target memory cell, and allowing the charge to be divided between the pair of bitlines.

Again, two neighboring sense amp circuits are shown with associated neighboring BLs and BLs. Sense amp 1110 neighbors sense amp 1115. Sense amp 1110 has bitline B1 1120 and bitline-bar B1 1122 which are associated with the sense amp 1110. Sense amp 1115 has a bitline B2 1124 and a bitline-bar B2 1126 which are associated with the sense amp 1115.

Isolation switch line 1130 is connected to the gates of bitline isolation transistors 1135. Optional bitline isolation transistors 1135 are normally ON, but for convenience, may be switched OFF just before the sense amp functions in order to reduce the sensing time. Bitline capacitance is large, therefore the sense amp may work faster without the bitlines under certain conditions.

Memory cells of the array of FeRAM memory cells 1100 may be addressed and selected by word lines, plate lines, and bitlines via decode logic of the same. One particular memory cell of the array of FeRAM memory cells is chosen as a target memory cell 1140, which is to be sensed for a read operation, comprising a FeCap 1142, and an pass gate transistor 1144. Pass gate transistors provide a means of selection and coupling of the target memory cell to a bitline associated with the target memory cell. For example, word line 1146 is connected to the gate of the pass gate transistor 1144 to select and couple FeCap 1142 to its associated bitline B2 1124, while the plate of FeCap 1142 is selected via plate line PL3 1148.

Exemplary schematic 1100 of FIG. 12A of the present invention illustrates a first dummy cell 1150 that provides a reference for a pair of bitlines, and a second dummy cell 1160 that provides a reference for a pair of bitline-bars shown. In one exemplary method, both dummy cells are precharged to a "0" state. A first dummy cell 1150 comprises a FeCap 1152, and two bitline access transistors 1153 & 1154. Bitline access transistors 1153 and 1154 are both addressed by dummy word line DW 1156. A second dummy cell 1160 comprises a FeCap 1162, and two bitline access transistors 1163 & 1164. Bitline access transistors 1163 and 1164 are both addressed by dummy word line DW 1166.

The bitline access transistors permit selection and shorting of a pair of bitlines or a pair of bitline-bars and a means of coupling the selected pair of bitlines or pair of bitline-bars to a FeCap. Thus depending on which bitline the target memory cell is coupled to, the appropriate opposite of the bitline pair associated with a sense amplifier may be selected. One of the two dummy cells 1150 & 1160 are therefore selectively coupled to a neighboring pair (a like bitline or bitline-bar in an adjacent sense amps pair of bitlines) of the plurality of bitlines. In the example of FIG. 12A, FeCap 1152 of the first dummy cell 1150, is coupleable to bitline B1 1120 and bitline B2 1124, while FeCap 1162 of the second dummy cell 1160, is coupleable to bitline-bar B1 1122 and a bitline-bar B2 1126.

While the FeCap in each dummy cell is being coupled to the selected pair of the plurality of bitlines, the selected dummy word line DW/DW also controls the associated pair of access transistors to short the selected pair of the plurality of bitlines. Thus, sense amps 1110 and 1115 which have neighboring pairs of bitline-bars (1122 & 1126) may be shorted by enabling DW 1166, so that the pair of access transistors 1164 & 1164 conduct, and neighboring pairs of bitlines (1120 & 1124) may be shorted by enabling DW 1156, so that the pair of access transistors 1154 & 1154 conduct.

Dummy storage transistors 1170 & 1175 permit recharging the FeCaps 1162 and 1152 respectively to the "0" state, via STORE DUMMY lines 1180, and STORE DUMMY line 1185 respectively.

In operation of the one dummy cell scheme of FIG. 12A, a particular memory cell is selected, for example target memory cell 1140 which is associated with bitline B2 1124, and sense amp 1115. As sense amp 1115 will have a sense signal from the target memory cell input to the BL input of the sense amp, the reference voltage will need to be produced on the BL input of the sense amp. Therefore, the dummy cell which comprises FeCap 1162 will be selected as this dummy cell has access transistors which are operable to short the bitline-bar pair B1 and B2 together in preparation as the reference bitline input to the sense amp, and operable to couple the dummy cell charge to the same.

To produce the reference voltage, the dummy cell comprising FeCap 1162, will share the "0" state charge with the shorted bitline-bar pair B1 and B2. As the capacitance of the two bitlines is relatively large and substantially equal in capacitance, sharing the "0" state charge with the shorted bitline-bar pair B1 and B2, produces substantially the same charge and voltage on each bitline.

For the example, the target memory cell 1140 is initialized with a 0V plate voltage at PL3 1148 and has its charge coupled to bitline B2 with pass gate transistor 1142 using word line W3 1146. As B2 is associated with the target memory cell, FeCap 1162 which is coupleable to B2 is selected to provide its' "0" state charge to the shorted bitline-bar pair B1 and B2 to produce the reference voltage for associated sense amp 1115. Thus, DW 1166 controls bitline access transistors 1162 & 1163 to couple from the "0" state charge on FeCap 1162 to the bitline-bar pair B1 1122 and B2 1126, and to simultaneously short the bitline-bar pair.

The B1 & B2 short is then removed, and the sense amp 1115 is enabled. In response, the target memory cell sense voltage on the B2 input of the sense amp, swings to one state, depending on its' "1" or "0" state, while the reference voltage swings toward the opposite state on the B2 input of sense amp 1115. The sense amp compares the two inputs, and a determination is made as to the "1" or "0" state of the target memory cell.

$½V_{CC}$ is then applied to the plate lines FeCap 1162 of the dummy cell and the target memory cell. $V_{CC}$ is applied to the word line W3 1146 of the target memory cell and STORE DUMMY 1180 of the dummy cell to recharge (restore) the dummy cell and the target memory cell to their original state.

The target memory cell and the dummy cells are disconnected from their associated bitlines so that the capacitance state is maintained. The target memory cell and the dummy cell plate lines are re-initialized to 0V, and are ready for another read operation.

Thus, from FIGS. 10A & 10B, and 12A, the dummy cell and the shorted pair of bitlines are shown to share as follows:

| Given: | $Q = C \cdot V$, and $V = Q/C$ |
|---|---|

Where Cbit is the bitline capacitance, and
Where Q is the charge transferred to the bitlines, and
Where V is the voltage drop induced on the bitlines due to the charge transfer:

| the "0" state charge is: | $Q_0 = 2P + 2R + S$ | and |
|---|---|---|
| the "0" state voltage is: | $V_0 = (2P + 2R + S)/Cbit$ | and |

Now the dummy cell at a "0" state charge transferring into the bitline pair

| connected together yield | $V_{DROP} = V_0/2$ or, $= Q_0/2Cbit$ | |
|---|---|---|
| Or: | $V_{DROP} = 2P + 2R + S/2$ Cbit | |
| Simplifying: | $V_{DROP} = (P + R + S/2)/Cbit$ | (1 dummy cell scheme) |
| Compared to: | $V_{DROP} = (P + R + S)/Cbit$ | (2 dummy cell scheme) |
| Thus, the difference is: | $V_{DROP} = S/2$ Cbit | (between 1 & 2 dummy cell scheme) |

$V_{DROP}$ is the voltage drop produced by the charge transfer from the "0" state dummy cell to the shorted bitlines associated with the sense amplifier and the target memory cell, but opposite the bitline coupled to the target memory cell. As shown above, we also see that the difference between these two exemplary sensing schemes is S/2 Cbit. As the quantity S is relatively small, the one dummy cell scheme is off the from the more centered two dummy cell scheme by a relatively small value.

Advantageously, the one dummy cell sensing scheme of FIG. 12A may provide a significantly centered reference voltage for a 1T1C FeRAM memory cell read operation in some applications, while requiring only two dummy cells, for example, for four or more bitlines.

Figure 12B:
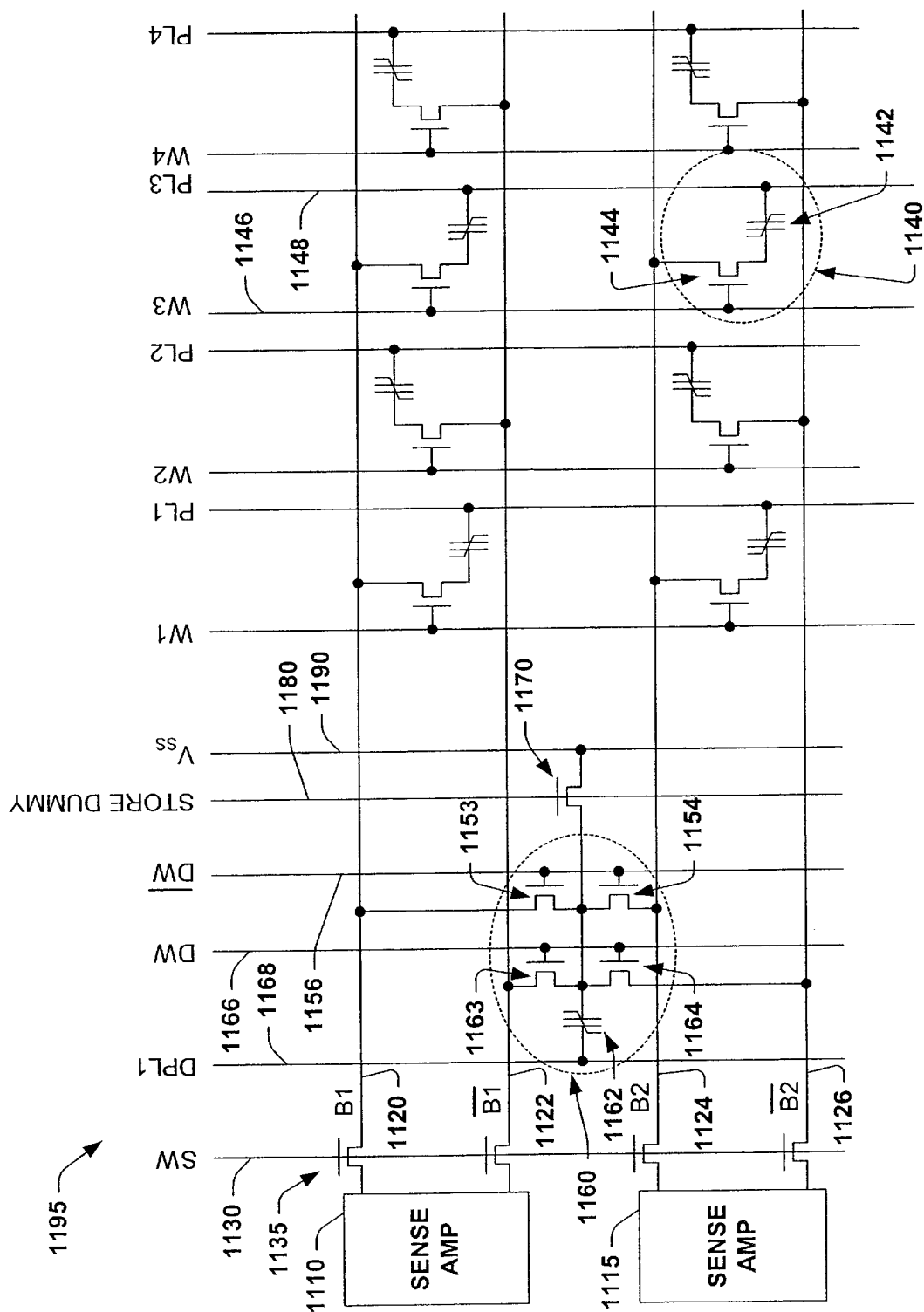
FIG. 12B is a schematic diagram illustrating an array portion of an exemplary one FeRAM dummy cell sensing scheme, wherein one dummy cell is used for a pair of bitlines and for a pair of bitline-bars using 1 dummy cell for 4 bitlines in a 1T1C FeRAM memory cell structure as described for FIG. 8, according to yet another aspect of the present invention.

FIG. 12B is a schematic 1195 which illustrates an array portion of another exemplary one FeRAM dummy cell sensing scheme, and as shown in the exemplary 1T1C FeRAM memory cell structure as described for FIG. 7. Most of the aspects of FIG. 12B are identical to those of FIG. 12A, as shown by the common reference numerals, except that the circuit of FIG. 12B uses only one dummy cell for all four of the bitlines represented, and therefore has bitline selectivity, and may require fewer control lines in this and some other aspects of the present invention. According to an aspect of the present invention, the single dummy cell and reference circuit of FIG. 12B may be used to sense the state of any memory cell attached to the plurality of bitlines.

Again, the FeRAM memory structure uses a reference circuit comprising an FeRAM dummy cell which is selectively coupleable to a plurality of bitlines. The reference circuit selects a pair of the plurality of bitlines and shorts together the selected pair of the plurality of bitlines, and generates a reference voltage. The reference circuit also applies the reference voltage to the selected pair of the plurality of bitlines associated with the reference circuit and the target memory cell during a read operation.

As FIGS. 12A and 12B have many aspects in common, only those areas which are different will be described herein. Exemplary schematic diagram 1195 of FIG. 12B of the present invention illustrates a dummy cell 1160 that provides a reference for a pair of the plurality of bitlines shown. In one exemplary method, the dummy cell is precharged to a "0" state. The dummy cell 1160 comprises a FeCap 1162, and two pairs of bitline access transistors 1153 & 1154, and 1163 & 1164. For example, the pair of bitline access transistors 1153 and 1154 are both addressed and shorted by dummy word line DW 1156, and the pair of bitline access transistors 1163 & 1164 are both addressed and shorted by dummy word line DW 1166.

The bitline access transistors permit selection and shorting of a pair of bitlines or a pair of bitline-bars and a means of coupling the selected pair of bitlines or pair of bitline-bars to dummy cell FeCap 1162. Thus depending on which bitline the target memory cell is coupled to, the appropriate opposite of the bitline pair associated with a sense amplifier may be selected. The dummy cell is therefore selectively coupleable to a pair of the plurality of bitlines. In the example of FIG. 12B, FeCap 1162 of the dummy cell 1160, is coupleable to bitline B1 1120 and bitline B2 1124, or, is coupleable to bitline-bar B1 1122 and a bitline-bar B2 1126.

Dummy storage transistor 1170 permits recharging the FeCap 1162 to the "0" state, via STORE DUMMY line 1180.

The target memory cell 1140 is initialized with a 0V plate voltage at PL3 1148 and has its charge coupled to bitline B2 with pass gate transistor 1142 using word line W3 1146. As B2 is associated with the target memory cell, bitline access transistors 1162 & 1163 which are coupleable to B2 are selected to couple the "0" state charge to the shorted bitline-bar pair B1 and B2 to produce the reference voltage for associated sense amp 1115. Thus, DW 1166 controls bitline access transistors 1162 & 1163 to couple from the "0" state charge on FeCap 1162 to the bitline-bar pair B1 1122 and B2 1126, and to simultaneously short the bitline-bar pair.

The B1 & B2 short is then removed, and the sense amp 1115 is enabled. In response, the target memory cell sense voltage on the B2 input of the sense amp, swings to one state, depending on its' "1" or "0" state, while the reference voltage swings toward the opposite state on the B2 input of sense amp 1115. The sense amp compares the two inputs, and a determination is made as to the "1" or "0" state of the target memory cell.

½$V_{CC}$ is then applied to the plate lines of FeCap 1162 of the dummy cell 1160 and the target memory cell 1140. $V_{CC}$ is applied to the word line W3 1146 of the target memory cell and STORE DUMMY 1180 of the dummy cell 1160 to recharge (restore) the target memory cell and the dummy cell to their original state. The target memory cell and the dummy cell are disconnected from their associated bitlines so that the capacitance state is maintained. The target memory cell and the dummy cell plate lines are re-initialized to 0V, and are ready for another read operation.

Advantageously, the one dummy cell sensing scheme of FIG. 12B may provide a significantly centered reference voltage for a 1T1C FeRAM memory cell read operation in some applications, while requiring only one dummy cell, for example, for four or more bitlines.

Figure 13:
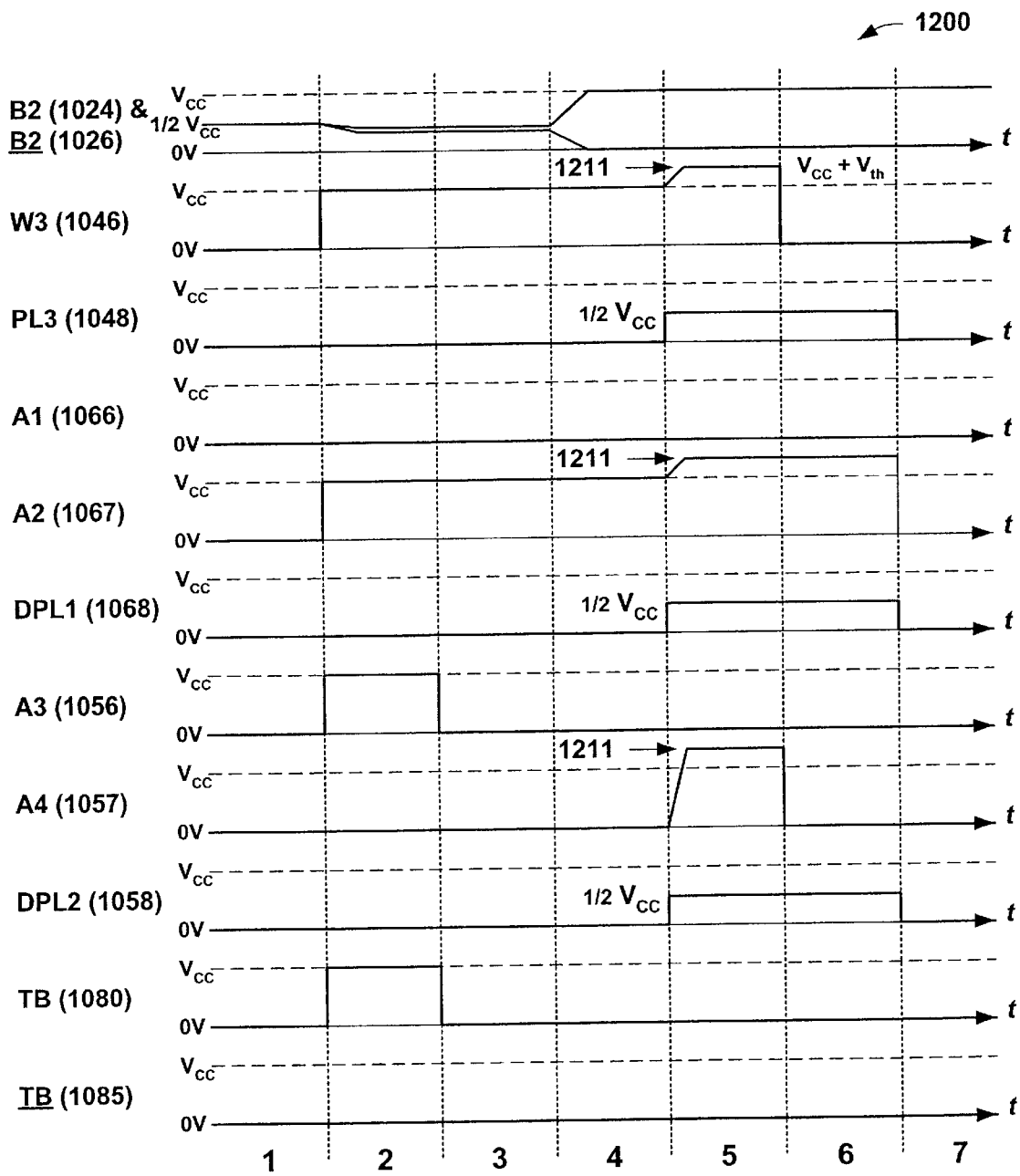
FIG. 13 is a timing diagram for the FeRAM read operation of FIG. 11 of the 2 dummy cell method, wherein the bitlines are precharged to ½$V_{CC}$ and the cell plate voltages are changed, according to an aspect of the present invention.

FIG. 13 is an exemplary timing diagram for the FeRAM read operation of FIG. 11, of the 2 dummy cell method. Two exemplary precharge schemes will be described in the following timing diagrams for the read operation of a target memory cell. In the first scheme, the bitlines are precharged to ½ $V_{CC}$, and the cell plate voltages are changed, according to an aspect of the present invention. In a second scheme the bitlines are precharged to $V_{CC}$, and the cell plate voltages are fixed to ½ $V_{CC}$, according to another aspect of the present invention. Seven time periods are represented at the bottom of each diagram. Time period 1 of each of the timing diagrams represents the initial or pre-existing conditions.

The following plots illustrate the first scheme and timing diagram 1200 of FIG. 13 for the read operation of the schematic of FIG. 11:

B2 (1024) & B2 (1026) is the response of bitline B2 (1024) & bitline-bar B2 (1026) to the read operation.

W3 (1046) is the word line input to the gate of the pass gate transistor 1044 of the target memory cell 1040.

PL3 (1048) is the plate line input to the FeCap 1042 of the target memory cell 1040.

A1(1066) is the address input to the gate of the bitline access transistor 1063 which couples bitline B1 1020 to second dummy cell 1060.

A2(1067) is the address input to the gate of the bitline access transistor 1062 which couples bitline-bar B2 1026 to second dummy cell 1060.

DPL1(1068) is the dummy plate line input to the FeCap 1062 of the second dummy cell 1060.

A3 (1056) is the address input to the gate of the bitline access transistor 1053 which couples bitline bar B1 1022 to first dummy cell 1050.

A4 (1057) is the address input to the gate of the bitline access transistor 1054 which couples bitline B2 1024 to first dummy cell 1050.

DPL2 (1058) is the dummy plate line input to the FeCap 1052 of the first dummy cell 1050.

TB 1080 is the bitline-bar shorting line input to the gate of the shorting transistor 1070 which shorts together the neighboring bitline-bars B1 (1022) & B2 (1026).

TB 1085 is the bitline-bar shorting line input to the gate of the shorting transistor 1075 which shorts together the neighboring bitlines B1 (1020) & B2 (1024).

The first scheme (the bitlines are precharged to ½ $V_{CC}$, and the cell plate voltages are changed) is illustrated in timing diagram 1200 of FIG. 13 and may for example, proceed as follows:

Time 1) Initially, as shown by the bitline response plot, B2 (1024) and B2-bar (1026), are precharged to 2 $V_{CC}$, while 0V is applied to PL3 (1048), DPL1 (1068), and DPL2(1058).

Time 2) $V_{CC}$ is applied to W3 (1046), A2(1067), A3 (1056) and TB (1080). A high on W3 (1046) makes pass gate transistor 1042 turn ON, and the charge in the target memory cell capacitance 1042 goes out to bitline B2 (1024). A high on TB (1080), makes shorting transistor 1070 turn ON coupling the neighboring bitline-bars B1 (1022) & B2 (1026). A high on A3 (1056) makes bitline access transistor 1053 turn ON and the charge in capacitance 1052 goes out to bitline-bar B1 (1022) and then bitline-bar B2 (1026). A high on A2(1067) makes bitline access transistor 1064 turn ON and the charge in capacitance 1062 goes out to bitline-bar B2 (1026). The two dummy cells share charge on the bitline-bars producing a reference voltage on B2 (1026), while a sense voltage produced on B2 (1024) is either higher or lower than the B2 voltage depending on the "1" or "0" state of the target memory cell 1040.

Time 3) 0V is applied to A3 (1056) and TB (1080). A low on TB (1080), makes shorting transistor 1070 turn OFF disconnecting the neighboring bitline-bars B1 (1022) & B2 (1026) from each other.

Time 4) Sense amplifier 1015 is enabled ON. Depending on the "1" or "0" state of the target memory cell 1040, sense amp 1015 inputs B2 (1024) will charge toward $V_{CC}$ and B2 (1026) will charge toward 0V, or B2 (1024) will charge toward 0V, and B2 (1026) will charge toward $V_{CC}$.

Time 5) ½ $V_{CC}$ is applied to PL3 (1048), DPL1(1068), and DPL2(1058). $V_{CC}+V_{TH}$ (1211, where $V_{TH}$ is the threshold voltage of transistors) is applied to W3 (1046), A2(1067), A4 (1057). Target memory cell capacitance 1042, and dummy cell capacitances 1052 and 1062 are recharged by the voltage difference of either ½ $V_{CC}$ or –½ $V_{CC}$. Note here, that dummy cell capacitances 1052 and 1062 are recharged differently, that is, if the first dummy cell is a "1", then the second dummy cell is a "0" state, and if the first dummy cell is a "0", then the second dummy cell is a "1" state.

Time 6) 0V is applied to W3 (1046), A2(1067), and A4 (1057). Thus, capacitances 1042 and 1052 are disconnected from B2, while capacitance 1062 is disconnected from B2, so that the state of the capacitances is maintained.

Time 7) 0V is applied to PL3 (1048), DPL1 (1068), and DPL2 (1058).

Figure 14:
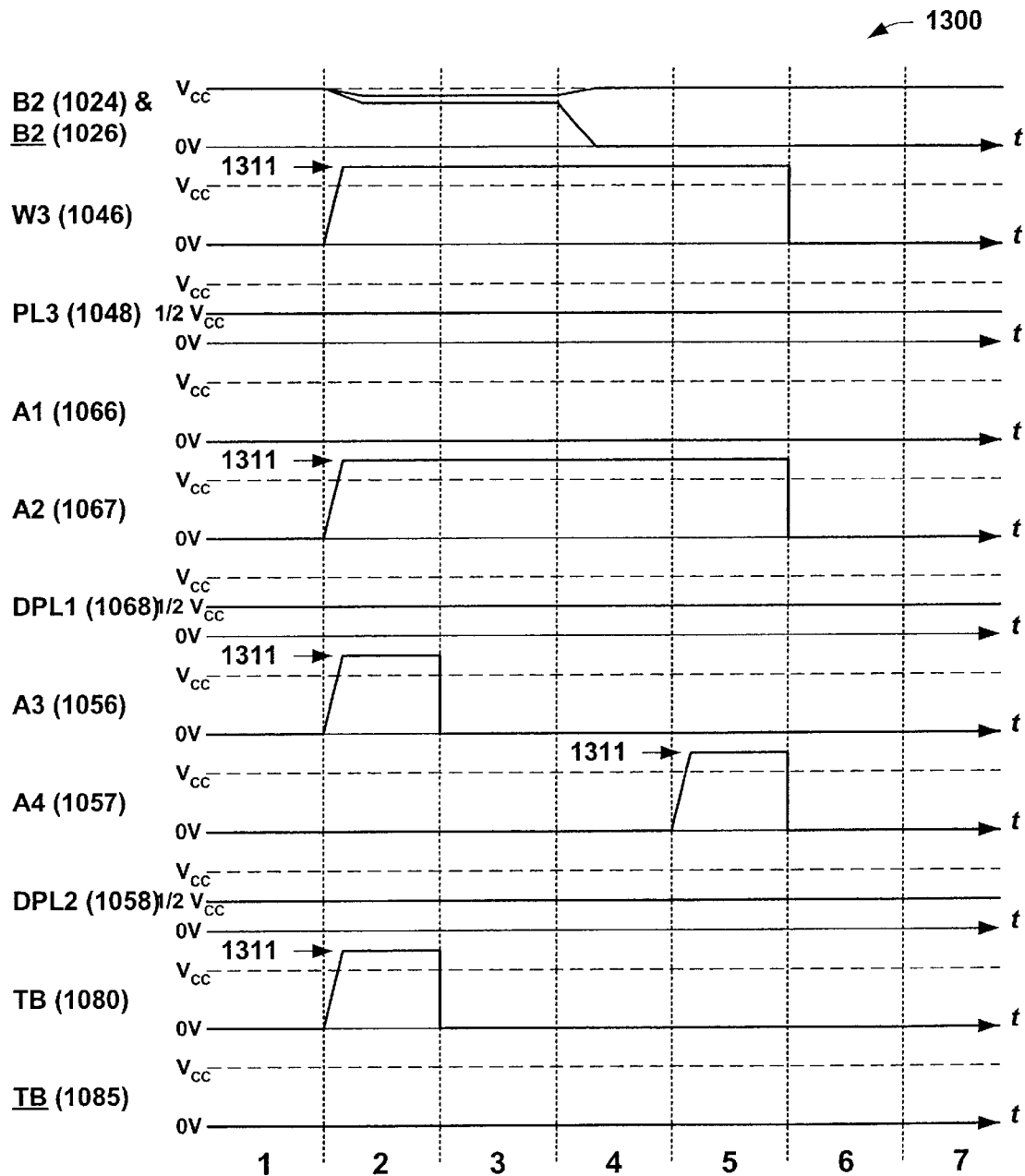
FIG. 14 is a timing diagram for the FeRAM read operation of FIG. 11 of the 2 dummy cell method, wherein the bitlines are precharged to $V_{CC}$ and the cell plate voltages are fixed to $\frac{1}{2}V_{CC}$, according to an aspect of the present invention.

FIG. 14 is another exemplary timing diagram 1300 for the FeRAM read operation of FIG. 11, of the 2 dummy cell method. The second scheme, wherein the bitlines are precharged to $V_{CC}$, and the cell plate voltages are fixed to ½ $V_{CC}$, is illustrated in timing diagram 1300 of FIG. 14 and may, for example, proceed as follows:

Time 1) Initially, as shown by the bitline response plot, B2 (1024) and B2-bar (1026), are precharged to $V_{CC}$, while ½ $V_{CC}$ is applied to PL3 (1048), DPL1 (1068), and DPL2 (1058).

Time 2) $V_{CC}+V_{TH}$ (1311, where $V_{TH}$ is the threshold voltage of transistors) is applied to W3 (1046), A2 (1067), A3 (1056) and TB (1080). A high on W3 (1046) makes pass gate transistor 1042 turn ON, and the charge in the target memory cell capacitance 1042 goes out to bitline B2 (1024). A high on TB (1080), makes shorting transistor 1070 turn ON coupling the neighboring bitline-bars B1 (1022) & B2 (1026). A high on A3 (1056) makes bitline access transistor 1053 turn ON and the charge in capacitance 1052 goes out to bitline-bar B1 (1022) and then bitline-bar B2 (1026). A high on A2 (1067) makes bitline access transistor 1064 turn ON and the charge in capacitance 1062 goes out to bitline-bar B2 (1026). The two dummy cells share charge on the bitline-bars producing a reference voltage on B2 (1026), while a sense voltage produced on B2 (1024) is either higher or lower than the B2 voltage depending on the "1" or "0" state of the target memory cell 1040.

Time 3) 0V is applied to A3 (1056) and TB (1080). A low on TB (1080), makes shorting transistor 1070 turn OFF disconnecting the neighboring bitline-bars B1 (1022) & B2 (1026) from each other.

Time 4) Sense amplifier 1015 is enabled ON. Depending on the "1" or "0" state of the target memory cell 1040, sense amp 1015 inputs B2 (1024) will charge toward $V_{CC}$ and B2 (1026) will charge toward 0V, or B2 (1024) will charge toward 0V, and B2 (1026) will charge toward $V_{CC}$. Target memory cell capacitance 1042, and dummy cell capacitance 1062 are recharged by the voltage difference of either ½ $V_{CC}$ or –½ $V_{CC}$.

Time 5) $V_{CC}+V_{TH}$ (1311) is applied to A4 (1057). Dummy cell capacitance 1052 is recharged by the voltage difference of either ½ $V_{CC}$ or –½ $V_{CC}$. Note here, that dummy cell capacitances 1052 and 1062 are recharged differently, that is, if the first dummy cell is a "1", then the second dummy cell is a "0" state, and if the first dummy cell is a "0", then the second dummy cell is a "1" state.

Time 6) 0V is applied to W3 (1046), A2 (1067), and A4 (1057). Thus, capacitances 1042 and 1052 are disconnected from B2, while capacitance 1062 is disconnected from B2, so that the state of the capacitances is maintained.

Figure 15A:
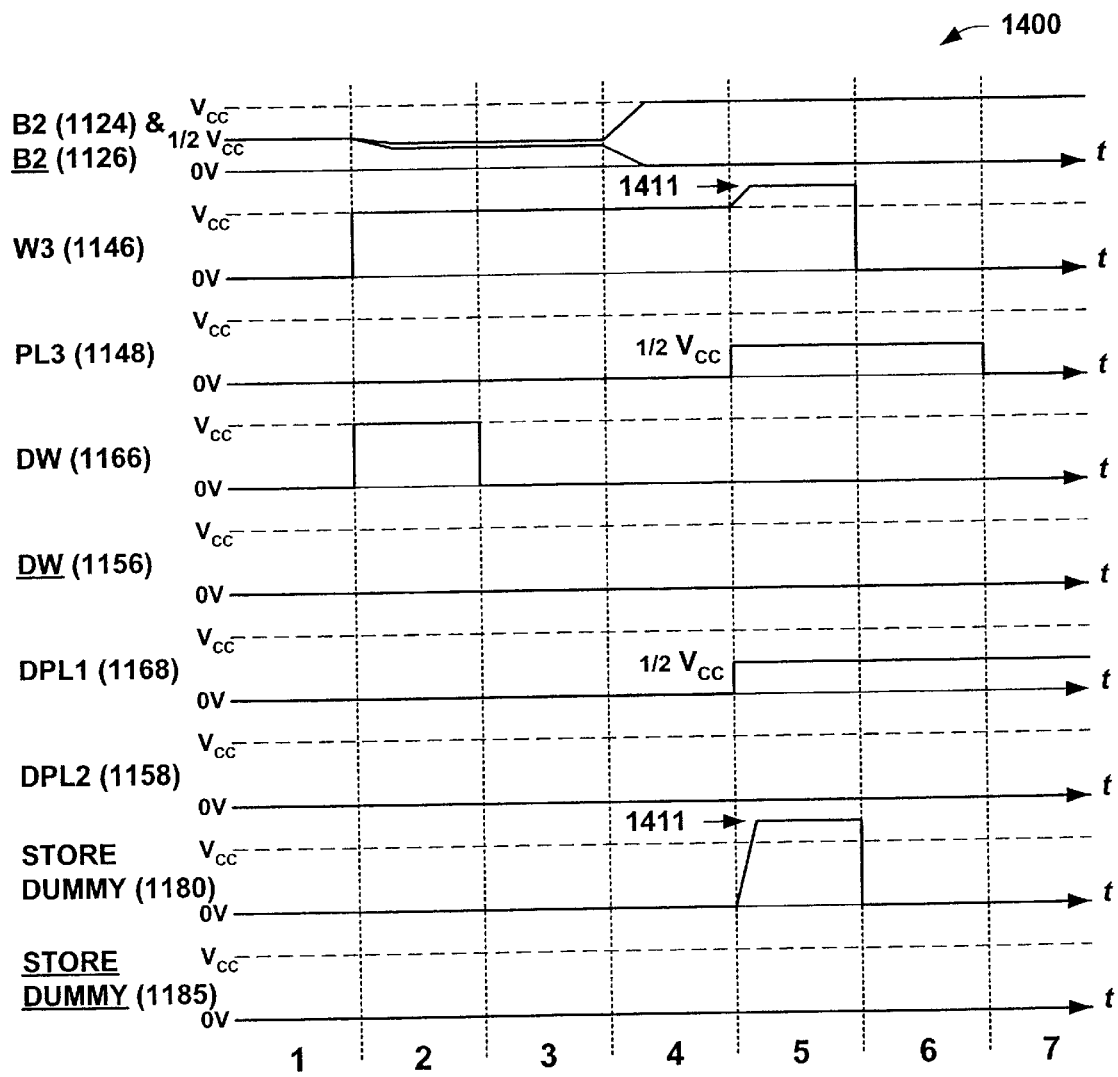
FIG. 15A is a timing diagram for the FeRAM read operation of FIG. 12A of the 1 dummy cell method, wherein the bitlines are precharged to $\frac{1}{2}V_{CC}$ and the cell plate voltages are changed, according to an aspect of the present invention.

FIG. 15A is an exemplary timing diagram 1400 for the FeRAM read operation of FIG. 12A, of the 1 dummy cell method, wherein the bitlines are precharged to ½ $V_{CC}$, and the cell plate voltages are changed, according to an aspect of the present invention.

The first scheme and timing diagram 1400 of FIG. 15A for the read operation of the schematic of FIG. 12A is illustrated by the following plots:

B2 (1124) & B2 (1126) is the response of bitline B2 (1124) & bitline-bar B2 (1126) to the read operation.

W3 (1146) is the word line input to the gate of the pass gate transistor 1044 of the target memory cell 1140.

PL3 (1148) is the plate line input to the FeCap 1142 of the target memory cell 1040.

DW (1166) is the word line input to the gates of the bitline access transistors 1163 & 1164 which couple bitline-bar B1 (1122) and bitline-bar B2 (1126) to the second dummy cell 1160, and also shorts together the neighboring bitline-bars B1 (1122) & B2 (1126).

DW (1156) is the word line input to the gates of the bitline access transistors 1153 & 1154 which couple bitline B1 (1120) and bitline B2 (1124) to the first dummy cell 1150, and also shorts together the neighboring bitlines B1 (1120) & B2 (1124).

DPL1 (1168) is the dummy plate line input to the FeCap 1162 of the second dummy cell 1160.

DPL2 (1158) is the dummy plate line input to the FeCap 1152 of the first dummy cell 1150.

STORE DUMMY 1180 is the dummy storage line input to the gate of the dummy storage transistor 1170 which restores the second dummy cell 1160 to the "0" state.

STORE DUMMY 1185 is the dummy storage line input to the gate of the dummy storage transistor 1175 which restores the first dummy cell 1150 to the "0" state.

The first scheme, wherein the bitlines are precharged to ½ $V_{CC}$, and the cell plate voltages are changed, is illustrated in timing diagram 1400 of FIG. 15A and may for example, proceed as follows:

Time 1) Initially, as shown by the bitline response plot, B2 (1124) and B2-bar (1126), are precharged to ½ $V_{CC}$, while 0V is applied to PL3 (1148), DPL1 (1168), and DPL2 (1158).

Time 2) $V_{CC}$ is applied to the target memory cell word line W3 (1146), and the dummy cell word line DW (1166). A high on W3 (1146) makes pass gate transistor 1142 turn ON, and the charge in the target memory cell capacitance 1142 goes out to bitline B2 (1124). A high on DW (1166), makes bitline access transistors 1163 & 1164 turn ON which shorts together the neighboring bitline-bars B1 (1122) & B2 (1126), while allowing the charge in capacitance 1062 to go out to bitline-bars B1 (1122) & B2 (1126). The dummy cell charge is shared between the two bitline-bars producing a reference voltage on B2 (1026), while the sense voltage produced on B2 (1024) is either higher or lower than the B2 voltage depending on the "1" or "0" state of the target memory cell 1040.

Time 3) 0V is applied to DW (1166). A low on DW (1166), makes bitline access transistors 1163 & 1164 turn OFF disconnecting the neighboring bitline-bars B1 (1022) & B2 (1026) from each other.

Time 4) Sense amplifier 1115 is enabled ON. Depending on the "1" or "0" state of the target memory cell 1140, sense amp 1115 inputs B2 (1124) will charge toward $V_{CC}$ and B2 (1126) will charge toward 0V, or B2 (1124) will charge toward 0V, and B2 (1126) will charge toward $V_{CC}$.

Time 5) ½ $V_{CC}$ is applied to PL3 (1148), and DPL1 (1168). $V_{CC}+V_{TH}$ (1411) is applied to W3 (1146) and STORE DUMMY 1180. Target memory cell capacitance 1142 is recharged by the voltage difference of either ½ $V_{CC}$ or –½ $V_{CC}$. Dummy cell capacitance 1162 is recharged by the voltage difference of –½ $V_{CC}$. (the difference between DPL1 and $V_{SS}$).

Time 6) 0V is applied to W3 (1146), and STORE DUMMY 1180. Thus, capacitance 1142 is disconnected from B2, while capacitance 1162 is disconnected from $V_{SS}$, so that the state of the capacitances is maintained. Note here, that both dummy cell capacitances 1152 and 1062 remain at the "0" state.

Time 7) 0V is applied to PL3 (1148).

Figure 15B:
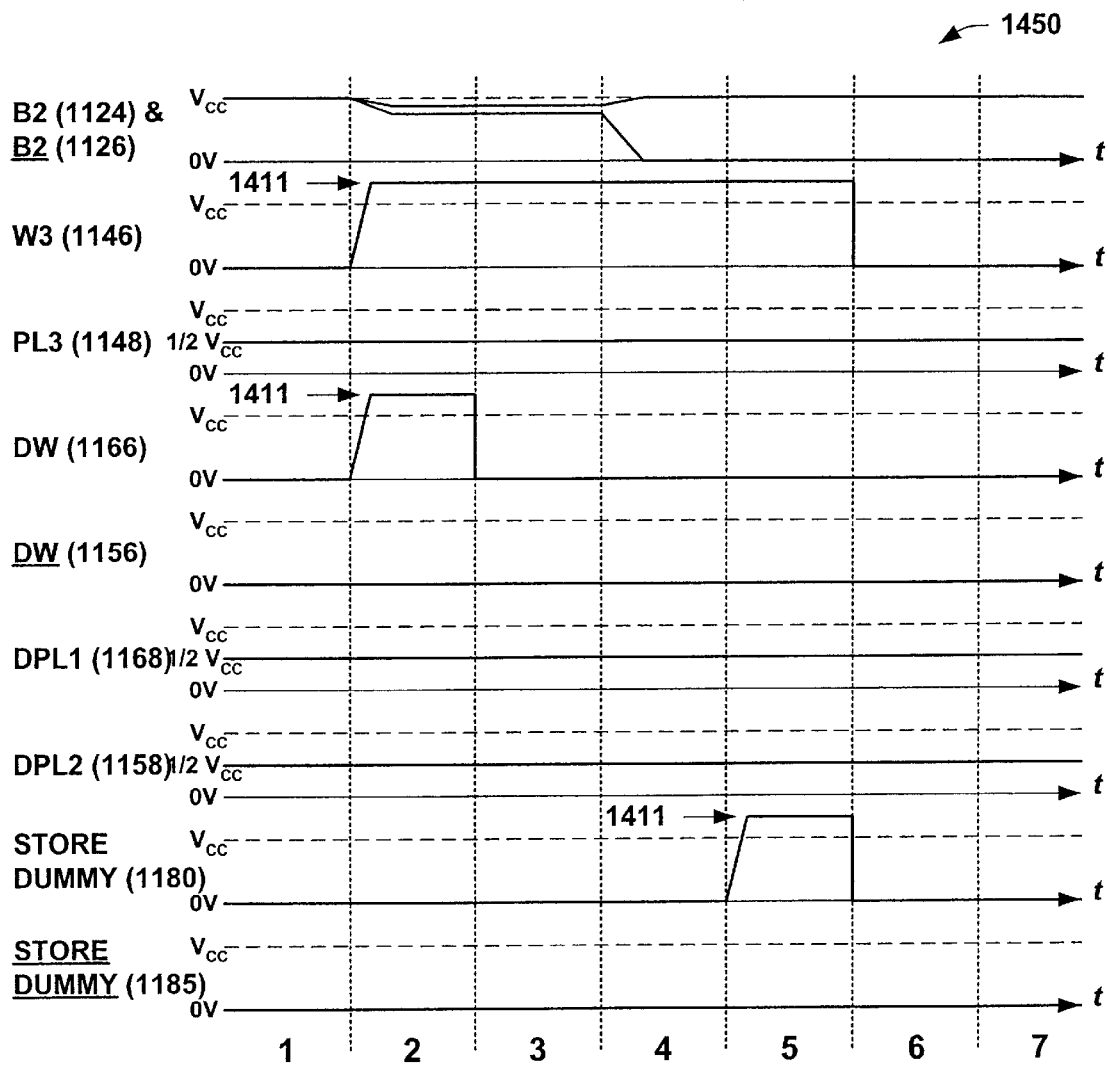
FIG. 15B is a timing diagram for the FeRAM read operation of FIG. 12A of the 1 dummy cell method, wherein the bitlines are precharged to $V_{CC}$ and the cell plate voltages are fixed to $\frac{1}{2}V_{CC}$, according to an aspect of the present invention.

FIG. 15B is another exemplary timing diagram 1450 for the FeRAM read operation of FIG. 12A, of the 1 dummy cell method. The second scheme, wherein the bitlines are precharged to $V_{CC}$, and the cell plate voltages are fixed to ½ $V_{CC}$, is illustrated in timing diagram 1450 of FIG. 15B and may, for example, proceed as follows:

Time 1) Initially, as shown by the bitline response plot, B2 (1124) and B2-bar (1126), are precharged to $V_{CC}$, while ½ $V_{CC}$ is applied to PL3 (1148), DPL1 (1168), and DPL2 (1158).

Time 2) $V_{CC}+V_{TH}$ (1411) is applied to the target memory cell word line W3 (1146), and the dummy cell word line DW (1166). A high on W3 (1146) makes pass gate transistor 1142 turn ON, and the charge in the target memory cell capacitance 1142 goes out to bitline B2 (1124). A high on DW (1166), makes bitline access transistors 1163 & 1164 turn ON which shorts together the neighboring bitline-bars B1 (1122) & B2 (1126), while allowing the charge in capacitance 1062 to go out to bitline-bars B1 (1122) & B2 (1126). The dummy cell charge is shared between the two bitline-bars producing a reference voltage on B2 (1026), while the sense voltage produced on B2 (1024) is either higher or lower than the B2 voltage depending on the "1" or "0" state of the target memory cell 1040.

Time 3) 0V is applied to DW (1166). A low on DW (1166), makes bitline access transistors 1163 & 1164 turn OFF disconnecting the neighboring bitline-bars B1 (1022) & B2 (1026) from each other.

Time 4) Sense amplifier 1115 is enabled ON. Depending on the "1" or "0" state of the target memory cell 1140, sense amp 1115 inputs B2 (1124) will charge toward $V_{CC}$ and B2 (1126) will charge toward 0V, or B2 (1124) will charge toward 0V, and B2 (1126) will charge toward $V_{CC}$.

Time 5) $V_{CC}+V_{TH}$ (1411) is applied to W3 (1146) and STORE DUMMY 1180. Target memory cell capacitance 1142 is recharged by the voltage difference of either ½ $V_{CC}$ or −½ $V_{CC}$. Dummy cell capacitance 1162 is recharged by the voltage difference of −½ $V_{CC}$ (the difference between DPL1 and $V_{SS}$).

Time 6) 0V is applied to W3 (1146), and STORE DUMMY 1180. Thus, capacitance 1142 is disconnected from B2, while capacitance 1162 is disconnected from $V_{SS}$, so that the state of the capacitances is maintained. Note here, that both dummy cell capacitances 1152 and 1062 remain at the "0" state.

Figure 16A:
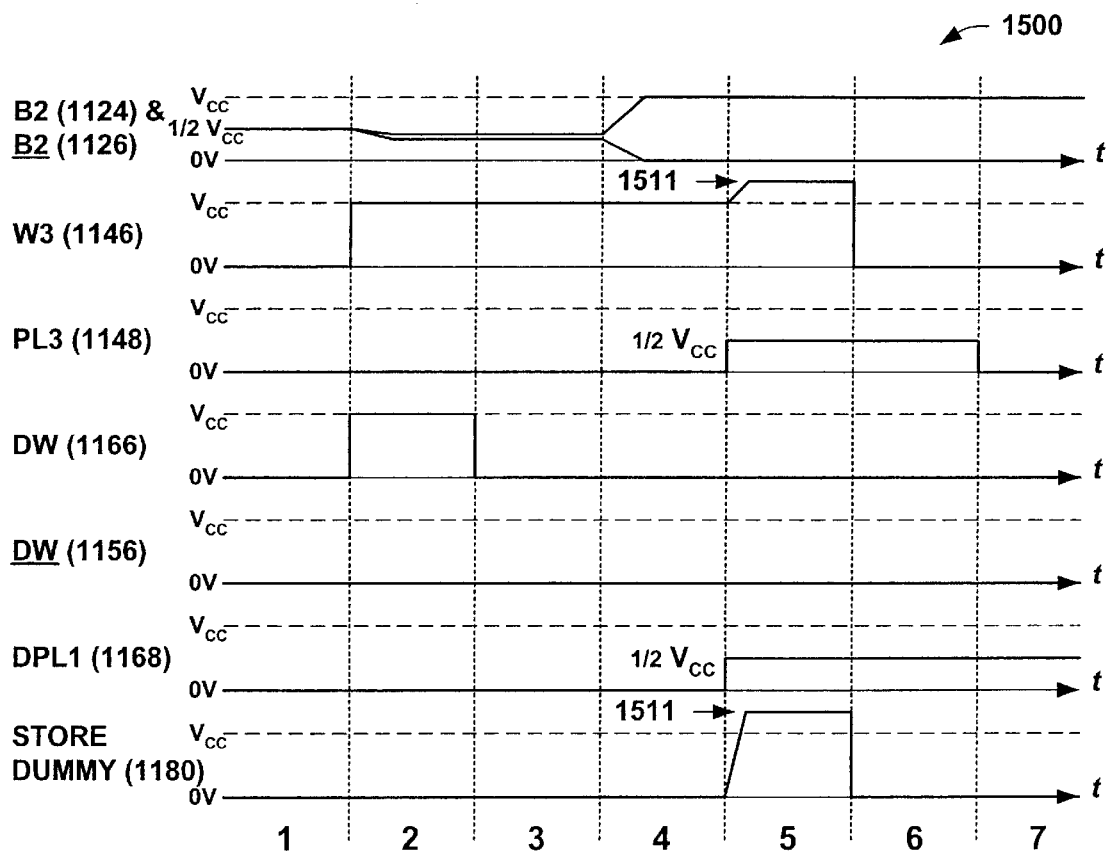
FIG. 16A is a timing diagram for the FeRAM read operation of FIG. 12B of the 1 dummy cell method, wherein the bitlines are precharged to $\frac{1}{2}V_{CC}$ and the cell plate voltages are changed, according to an aspect of the present invention.

FIG. 16A is another exemplary timing diagram 1500 for the FeRAM read operation of FIG. 12B, of the 1 dummy cell method, wherein the bitlines are precharged to ½ $V_{CC}$, and the cell plate voltages are changed, according to an aspect of the present invention. The memory circuit of FIG. 12B performs a read operation similar to that of FIG. 12A, except that the dummy plate line DPL2 (1158) and the STORE DUMMY line (1185) are not needed, as only one dummy cell 1160 (and more specifically, one FeCap 1162) is needed for the 4 bitlines as shown. One of the two sets of combination bitline accessing and shorting transistors (1163 & 1164, or 1153 & 1154) are simply addressed through the two choices of dummy word lines DW (1166) or DW (1156), depending on whether the bitline-bars or the bitlines need to be accessed as a reference input to the sense amp.

Thus, if the target memory cell is accessible to the bitline (as in FIG. 12B), then the bitline-bars are selected to provide the reference voltage via DW (1166). If however, the target memory cell is accessible to the bitline-bar, then the bitlines are selected to provide the reference voltage via DW (1156).

Figure 16B:
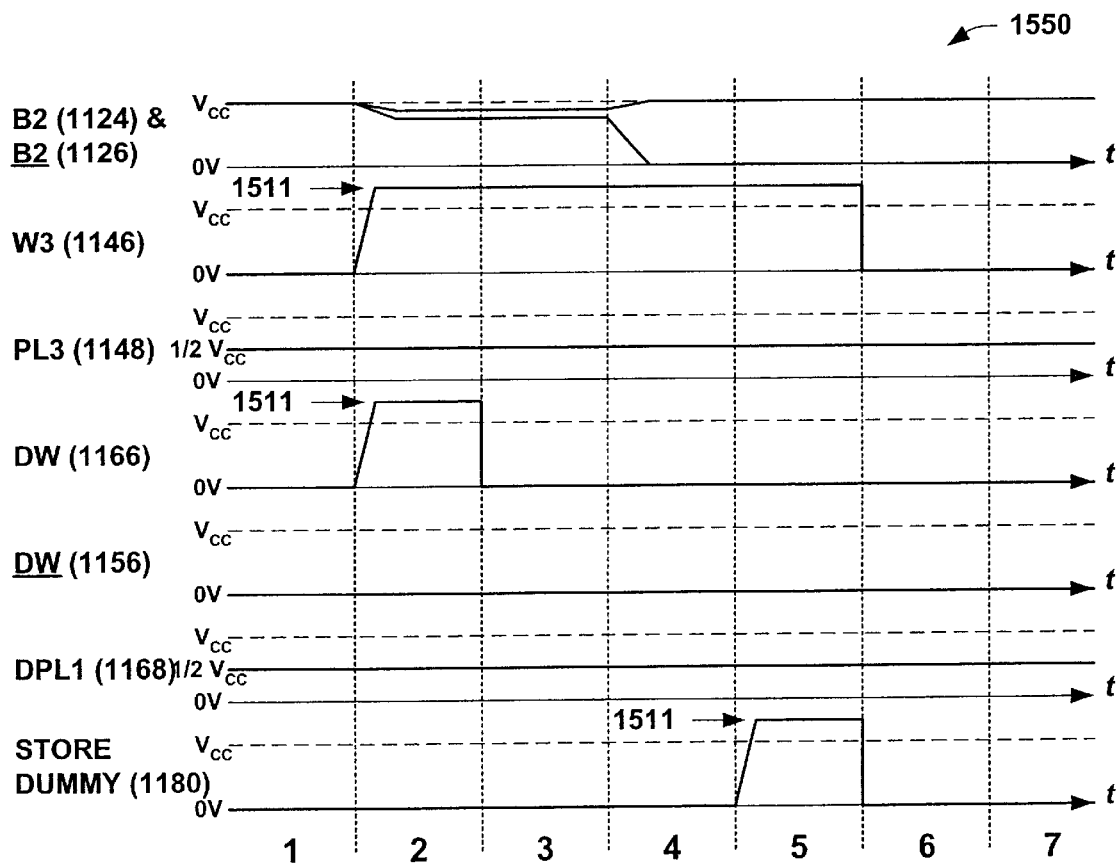
FIG. 16B is a timing diagram for the FeRAM read operation of FIG. 12B of the 1 dummy cell method, wherein the bitlines are precharged to $V_{CC}$ and the cell plate voltages are fixed to $\frac{1}{2}V_{CC}$, according to an aspect of the present invention.

FIG. 16B is yet another exemplary timing diagram 1550 for the FeRAM read operation of FIG. 12B, of the 1 dummy cell method, wherein the bitlines are precharged to $V_{CC}$, and the cell plate voltages are fixed to ½ $V_{CC}$, according to an aspect of the present invention. The memory circuit of FIG. 12B performs a read operation similar to that of FIG. 12A, except that the dummy plate line DPL2 (1158) and the STORE DUMMY line (1185) are not needed, as only one dummy cell 1160 (and more specifically, one FeCap 1162) is needed for the 4 bitlines as shown.

In contrast to other prior art 1T1C FeRAM memory devices, the circuits and methods of the present invention seek to reduce in certain instances, the number of dummy cells, and more specifically, the number of FeCaps required for the generation of an accurate reference voltage, while also simplifying and or reducing the quantity of control lines. Yet another advantage of reduction and simplification, has been shown available, thru the multipurpose use of the bitline access transistors within the dummy cells, which also may serve as the bitline shorting transistor.

Advantageously, the two dummy cell sensing scheme may provide a significantly centered reference voltage for a 1T1C FeRAM memory cell read operation in some applications, for example, requiring only two FeCaps for four bitlines.

The one dummy cell sensing scheme, in some instances may also provide a desirable means of providing a reference for four or more bitlines.

Thus, the present invention provides a 1T1C FeRAM memory devices for the read sensing of a target memory cell of an array of FeRAM memory cells. The memory device of the present invention includes a reference circuit comprising a dummy cell, which is selectively coupleable to a plurality of bitlines, and is operable to generate a reference voltage with the charge on the dummy cell and a sharing of the charge to the plurality of bitlines or another dummy cell during a read operation of a target memory cell.

Another aspect of the present invention provides a methodology for 1T1C FeRAM memory device read cycle operation and sensing of a target memory cell of an array of FeRAM memory cells and the manufacture of such devices illustrated and described herein, as well as with other such devices.

Figure 17:
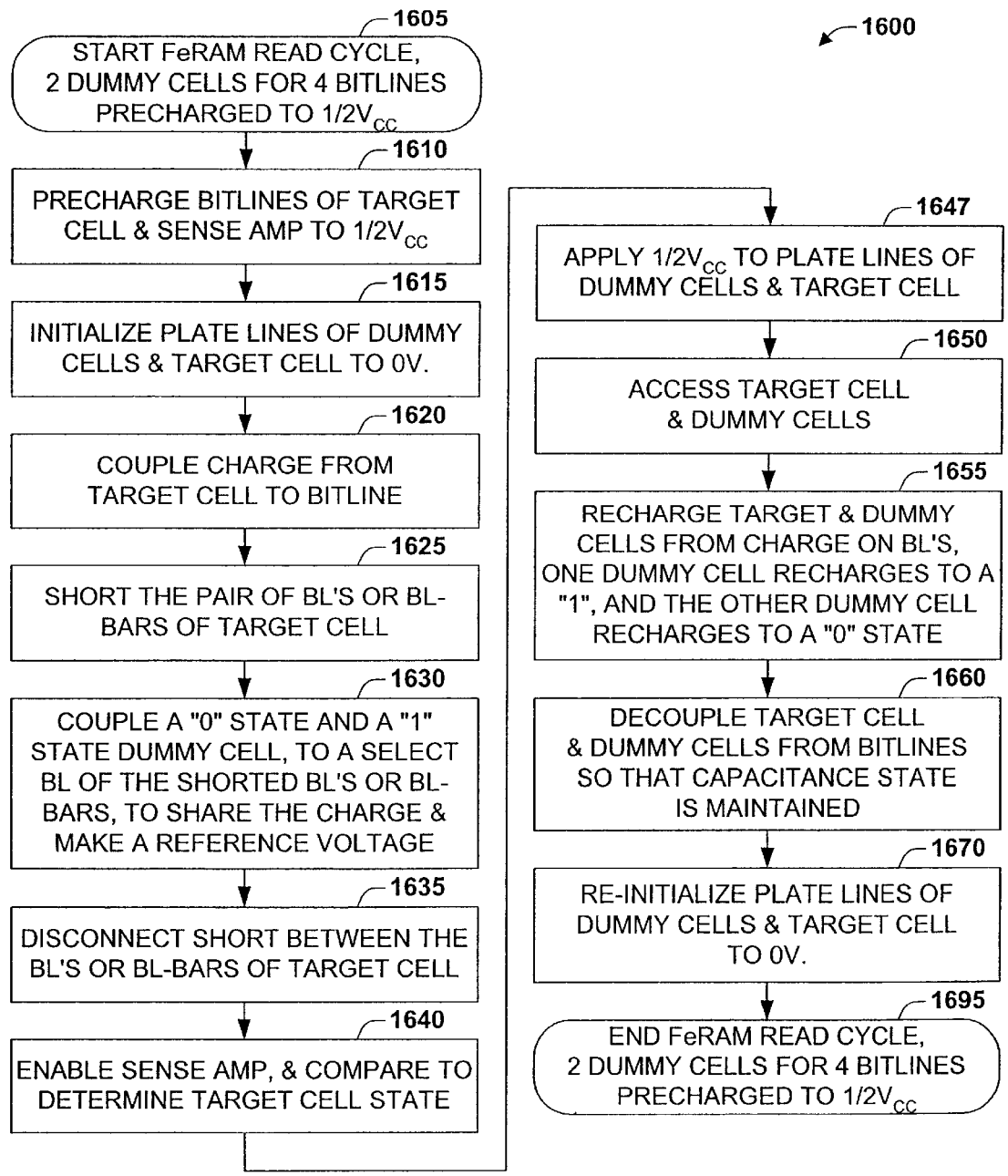
FIG. 17 is a flow diagram illustrating an exemplary method for the read operation of a 1T1C memory cell of an FeRAM array using a 2 dummy cell for 4-bitline memory structure in association with an aspect of the present invention.

Referring now to FIG. 17, an exemplary method 1600 is illustrated for the read operation of a 1T1C memory cell of an FeRAM array using a 2 dummy cell for 4 bitline memory structure in association with an aspect of the present invention. While the exemplary method 1600 is illustrated and described herein as a series of acts or events, it will be appreciated that the present invention is not limited by the illustrated ordering of such acts or events, as some acts or events may occur in different orders and/or concurrently with other acts or events apart from that shown and described herein, in accordance with the invention. In addition, not all illustrated acts or events may be required to implement a methodology in accordance with the present invention. Moreover, it will be appreciated that the method 1600 may be implemented in association with the apparatus and systems illustrated and described herein as well as in association with other systems not illustrated.

The method 1600 comprises read cycle operation and sensing of a target memory cell of an array of FeRAM memory cells, wherein the 1T1C FeRAM memory device combines two dummy cells of opposite state charges ("0" & "1") used to generate a reference voltage, wherein each dummy cell comprises a single ferroelectric capacitor and one or more pairs of bitline access transistors, permits the generation of a reference voltage which is substantially centered between a "0" and a "1" state, and wherein the dummy cell is selectively coupleable to a plurality of bitlines associated with a sense amplifier and the target memory cell, whereby a greater margin for determining a "0" and a "1" state of the target memory cell of an FeRAM array may be obtained.

Figure 18:
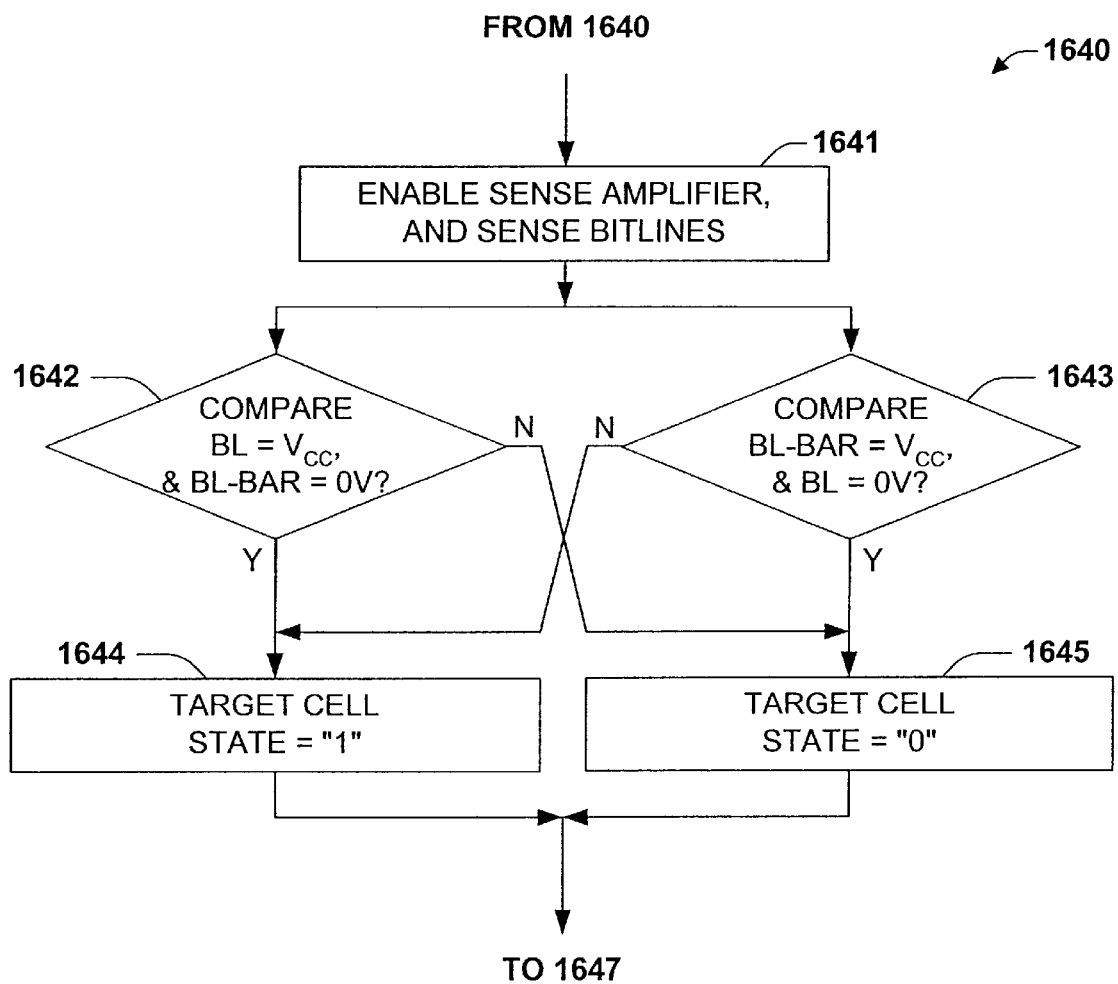
FIG. 18 is a flow diagram illustrating an exemplary method for the enable sense amp and compare to determine the target cell state operation of the read operation of FIG. 17 in association with an aspect of the present invention.

The two dummy cell sensing scheme is illustrated in the method of FIGS. 17 & 18 according to the circuit of FIG. 11. The two dummy cell read cycle method begins at 1605. In one exemplary implementation of this scheme, a particular memory cell is initially selected, for example a target memory cell which is associated with a bitline, and a sense amplifier. At 1610 a bitline and a bitline-bar associated with the target memory cell and the sense amplifier, are precharged to ½ $V_{CC}$, and the cell plate voltages are changed. Optionally, the bitlines associated with a selected target memory cell and a sense amplifier, are precharged to $V_{CC}$, and the cell plate voltages are fixed to ½ $V_{CC}$.

At 1615 the plate lines of the dummy cells and the target cell are initialized to 0V. At 1620 the charge on the target memory cell is coupled to its associated bitline or bitline-bar. The other of the bitline and bitline-bar associated with the target memory cell is shorted together with a neighboring at 1625, wherein a high on the TB or TB shorting line causes a shorting transistor to couple a pair of BLs or BLs together, respectively, as the bitline input to the sense amp which will have the reference voltage.

In this exemplary method, the reference voltage will be produced on the other of the bitline or bitline-bar which is coupled to the target memory cell. The selection of this other of the bitline or bitline-bar which is coupled to the target memory cell, is made at 1630, and the reference voltage is generated by coupling a dummy cell which was precharged to a "0" state, to share charge (via the shorted BLs or BLs), with another dummy cell which was precharged to a "1" state. Thus, the shared "0" and "1" state dummy cell charges, generates a reference voltage on the shorted neighboring BLs or BLs which is substantially centered between the "0" and "1" states. At 1635 the short is removed from the shorted neighboring BLs or BLs.

The sense cycle begins at 1640 of FIG. 17 and is expanded on to FIG. 18. At this point, the sense amplifier has the reference voltage on one BL or BL sense amp input, and a sense signal from the target memory cell on the other of the BL or BL sense amp inputs. As the sense amp is enabled at 1641 of FIG. 18, the inputs respond to the sensing process by charging to opposite state levels depending on the "0" or "1" state of the target memory cell. For example, depending on the "1" or "0" state of the target memory cell, one sense amp input will charge toward $V_{CC}$ and the other sense amp input will charge toward 0V.

After an appropriate settling time, the sense amp differentially compares at 1642 & 1643, the two BL or BL sense amp inputs, to determine which input is greater. At 1642 a determination is made if the BL is now at $V_{CC}$ and the BL is at 0V. At 1643 a determination is made if the BL is now at $V_{CC}$ and the BL is at 0V. If a determination was made at 1642 that BL is now at $V_{CC}$ and the BL is at 0V, then the target memory cell is identified as having a "1" state at 1644. Otherwise, at 1645 the target memory cell is identified as having a "0" state, and the method continues to 1647 of FIG. 17. Further, If a determination was made at 1643 that BL is now at $V_{CC}$ and the BL is at 0V, then the target memory cell is identified as having a "0" state at 1645. Otherwise, at 1644 the target memory cell is identified as having a "1" state, and the method continues to 1647 of FIG. 17.

At 1647 ½ $V_{CC}$ is applied to the plate lines of the dummy cells and the target memory cell. The target memory cell and the dummy cells are accessed at 1650 by applying $V_{CC}+V_{TH}$ (where $V_{TH}$ is the threshold voltage of transistors), to the word line of the target memory cell and to the address lines of the dummy cells. The target memory cell capacitance, and dummy cell capacitances are recharged (or restored) at 1655 by the voltage difference of either ½ $V_{CC}$ or -½ $V_{CC}$. Note here, that the dummy cell capacitances are recharged differently, that is, if the first dummy cell is a "1", then the second dummy cell is a "0" state, and if the first dummy cell is a "0", then the second dummy cell is a "1" state.

At 1660 the capacitance of the target memory cell is disconnected from its' associated BL or BL, and the capacitances of the dummy cells are disconnected from the other associated BL or BL, so that the state of the capacitance is maintained. Finally, the dummy cells and the target memory cell are re-initialized by applying 0V to their plate lines.

Thereafter the FeRAM read cycle operation ends at 1695, and the method 1600 may be repeated for subsequent read cycle operations of a memory device using 2 dummy cells for 4 bitlines.

The methodology 1600 thus provides for an FeRAM memory structure to accurately read the state of a target memory cell of an array of 1T1C FeRAM memory cells which is capable of using a small number of dummy cells for producing an accurate reference voltage and is able to accomplish neighboring bitline shorting and access in the same simple control circuit. The FeRAM memory structure of the present invention, comprises a pair of oppositely precharged FeRAM dummy cells, which are selectively coupleable to a plurality of bitlines, and which share charge with each other and a pair of shorted neighboring bitlines. Accordingly, a reference voltage is provided which is substantially centered between a "0" and a "1" state. Using this substantially centered reference voltage, the sense amplifier may then determine a "0" and a "1" state of the target memory cell of an FeRAM array to a greater margin.

The dummy cell structure and the particular sensing scheme of the present invention, provide a dummy cell with a single FeCap within each dummy cell for a pair of bitlines, thereby in some implementations reducing the area requirements, quantity of control lines, and providing greater layout flexibility with fewer dummy cells. What makes this feature possible is a reference circuit comprising a dummy cell control circuit, which provides a means of coupling the FeCap (within the dummy cell) to a plurality of bitlines. Therefore, the reference circuit FeCap is not dedicated to coupling to one particular bitline, but is able to be coupled to plurality of bitlines according to the invention.

Other variants of methodologies may be provided in accordance with the present invention, whereby a 1T1C FeRAM read cycle operation is accomplished employing a dummy cell comprising a single FeCap and selective coupling to a plurality of bitlines.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of sensing an FeRAM 1T1C cell in a read operation requiring only 1 dummy cell for 4 bitlines, comprising:

precharging to ½$V_{CC}$, a bitline & a bitline-bar associated with a target memory cell and a sense amplifier;

initializing to 0 volts, the plate line of an FeRAM dummy cell associated with the target memory cell, and the plate line of the target memory cell;

accessing & coupling the charge of the target memory cell to the bitline or the bitline-bar of the sense amplifier associated with the target memory cell;

shorting together two bitlines or two bitline-bars associated with the target memory cell and the FeRAM dummy cell, to create a shorted pair of bitlines or bitline-bars;

selectively coupling the dummy cell to a select one of the two shorted bitlines or the two shorted bitline-bars associated with the target memory cell and the FeRAM dummy cell, wherein the FeRAM dummy cell comprises a "0" state FeCap associated therewith, thereby generating a reference voltage with a reference circuit, which is a function of a charge shared to and divided between the two shorted bitlines or the two shorted bitline-bars;

de-coupling the short between the bitlines or bitline-bars associated with the target memory cell;

sensing the bitline inputs of the sense amplifier associated with the target memory cell;

comparing with the sense amplifier, a sense signal from the target memory cell on one bitline input, to the reference voltage on the other bitline input, wherein the reference voltage is substantially centered between a "0" or "1" state of an FeRAM memory cell, thereby yielding an accurate sensing of the FeRAM 1T1C cell in a read operation;

determining if the target memory cell is a "0" or a "1" state based on the comparison;

applying $½V_{CC}$ to the plate line of the FeRAM dummy cell associated with the target memory cell, and the plate line of the target memory cell;

accessing the target memory cell via a word line, and the FeRAM dummy cell associated with the target memory cell via a transistor coupled to $V_{SS}$;

recharging the FeRAM dummy cell which is associated with the target memory cell, and the target memory cell via the bitlines associated with the target memory cell, wherein the FeRAM dummy cell recharges to a "0" state, and the target memory cell recharges to its former "0" or "1" state;

de-coupling the target memory cell and the FeRAM dummy cell from the associated bitlines so that the capacitance states are maintained;

reinitializing to 0 volts, the plate line of the FeRAM dummy cell associated with the target memory cell, and the plate line of the target memory cell.

2. The method of claim 1, further comprising:

waiting until the charge sharing between the FeRAM dummy cell, comprising a "0" state and the shorted pair of bitlines or bitline-bars associated therewith, has reached a sufficiently averaged level of the reference voltage on the shorted bitlines or bitline-bars associated with the target memory cell and the FeRAM dummy cell.

3. The method of claim 1, wherein the shorting together two bitlines or two bitline-bars associated with the target memory cell and the FeRAM dummy cell to create two shorted bitlines or two shorted bitline-bars is further accomplished by enabling two bitline access transistors.

4. The method of claim 1, wherein the de-coupling the short between the bitlines or bitline-bars associated with the target memory cell and the FeRAM dummy cell is further accomplished by disabling two bitline access transistors.

5. The method of claim 1, wherein the bitline & the bitline-bar associated with the target memory cell and the sense amplifier, are precharged to $V_{CC}$, and the cell plate voltages are fixed to $½V_{CC}$.

* * * * *